(12) United States Patent
Yamada

(10) Patent No.: US 10,186,609 B2
(45) Date of Patent: Jan. 22, 2019

(54) SEMICONDUCTOR DEVICE, RC-IGBT, AND METHOD OF MANUFACTURING SEMICONDUCTOR DEVICE

(71) Applicant: Renesas Electronics Corporation, Koutou-ku, Tokyo (JP)

(72) Inventor: Kazuhiro Yamada, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/706,403

(22) Filed: Sep. 15, 2017

(65) Prior Publication Data

US 2018/0151711 A1 May 31, 2018

(30) Foreign Application Priority Data

Nov. 30, 2016 (JP) .................................. 2016-232547

(51) Int. Cl.
*H01L 29/74* (2006.01)
*H01L 31/111* (2006.01)
(Continued)

(52) U.S. Cl.
CPC ...... *H01L 29/7397* (2013.01); *H01L 27/0647* (2013.01); *H01L 29/0619* (2013.01);
(Continued)

(58) Field of Classification Search
CPC ............. H01L 29/7397; H01L 29/7395; H01L 29/0696; H01L 29/0804; H01L 29/66325
(Continued)

(56) References Cited

U.S. PATENT DOCUMENTS 8,716,747 B2 5/2014 Saito et al.
9,041,050 B2 5/2015 Matsuura
(Continued)

FOREIGN PATENT DOCUMENTS

JP 2011-216825 A 10/2011
JP 2013-197122 A 9/2013
(Continued)

OTHER PUBLICATIONS

Extended European Search Report dated Apr. 24, 2018, in European Patent Application No. 17191025.0.

*Primary Examiner* — Theresa T Doan
(74) *Attorney, Agent, or Firm* — Shapiro, Gabor and Rosenberger, PLLC

(57) ABSTRACT

According to one embodiment, a semiconductor device 100 includes a semiconductor substrate 1 including a first principal surface and a second principal surface, an emitter electrode 46, a gate wiring 49, a collector electrode 43, a first unit cell region 10 that is extended along one direction in a plane parallel to the first principal surface, and a second unit cell region 20 that is extended along one direction, in which the semiconductor substrate 1 of the first unit cell region 10 and the second unit cell region 20 includes an N− type drift layer 39, an N type hole barrier layer 38, a trench electrode 13, a P type body layer 36, an insulating film 35, an N type field stop layer 41, and a P+ type collector layer 42, and the second unit cell region 20 includes an N type cathode layer 47 that is fitted into the collector layer 42 and is extended along one direction.

20 Claims, 15 Drawing Sheets

(51) Int. Cl.
  *H01L 29/739* (2006.01)
  *H01L 27/06* (2006.01)
  *H01L 29/06* (2006.01)
  *H01L 29/08* (2006.01)
  *H01L 29/66* (2006.01)
  *H01L 29/40* (2006.01)
  *H01L 29/861* (2006.01)
  *H01L 29/423* (2006.01)

(52) U.S. Cl.
  CPC ...... *H01L 29/0692* (2013.01); *H01L 29/0696* (2013.01); *H01L 29/0804* (2013.01); *H01L 29/0834* (2013.01); *H01L 29/407* (2013.01); *H01L 29/66348* (2013.01); *H01L 29/861* (2013.01); *H01L 29/4238* (2013.01)

(58) Field of Classification Search
  USPC .......................................................... 257/139
  See application file for complete search history.

(56) References Cited

U.S. PATENT DOCUMENTS

| | | | |
|---|---|---|---|
| 9,153,674 B2 * | 10/2015 | Schulze | H01L 29/0696 |
| 9,159,721 B2 | 10/2015 | Okawara et al. | |
| 9,356,115 B2 | 5/2016 | Mizushima | |
| 9,508,798 B2 * | 11/2016 | Fukuda | H01L 29/7813 |
| 2013/0240947 A1 | 9/2013 | Matsudai et al. | |
| 2014/0231867 A1 | 8/2014 | Yamashita et al. | |
| 2015/0155277 A1 | 6/2015 | Ogura et al. | |
| 2016/0035867 A1 | 2/2016 | Pfirsch et al. | |
| 2016/0111529 A1 | 4/2016 | Hirabayashi et al. | |

FOREIGN PATENT DOCUMENTS

| | | |
|---|---|---|
| JP | 2013-197306 A | 9/2013 |
| JP | 2013-247248 A | 12/2013 |
| JP | 2015-165541 A | 9/2015 |
| JP | 2016-082097 A | 5/2016 |

* cited by examiner

SEMICONDUCTOR DEVICE, RC-IGBT, AND METHOD OF MANUFACTURING SEMICONDUCTOR DEVICE

CROSS-REFERENCE TO RELATED APPLICATIONS

This application is based upon and claims the benefit of priority from Japanese patent application No. 2016-232547, filed on Nov. 30, 2016, the disclosure of which is incorporated herein in its entirety by reference.

BACKGROUND

The present invention relates to a semiconductor device, an RC-IGBT, and a method of manufacturing the semiconductor device, and relates to, for example, a semiconductor device mounted on electric vehicles, other mechanical equipment or the like that use motors, an RC-IGBT, and a method of manufacturing the semiconductor device.

A motor driving power device is mounted on electric vehicles, other mechanical equipment or the like that use motors. The motor driving power device includes, for example, an insulated gate bipolar transistor (hereinafter, it will be called an IGBT) and a free wheeling diode (hereinafter, it will be called an FWD) used together with the IGBT.

A Reverse-Conducting IGBT (hereinafter it will be called an RC-IGBT) is composed of an IGBT and an FWD formed in a single chip. In the RC-IGBT, an n type cathode layer is formed on a rear surface of the FWD. Then a cathode layer of the FWD that has been formed is bonded to both a collector layer of the IGBT and electrodes on the rear surface. In this way, the RC-IGBT is formed to be a single chip and has been practically used for a small-capacity chip targeted for home appliances and the like.

U.S. Pat. No. 9,041,050 discloses, in the specification, an Injection Enhancement (IE) type trench gate IGBT composed of first linear unit cell regions having linear active cell regions, second linear unit cell regions having linear hole collector regions, and linear inactive cell regions disposed between the first and second linear unit cell regions. This document discloses that, according to the aforementioned structure, reduction of the switching speed caused by IE effects can be prevented.

Japanese Unexamined Patent Application Publication No. 2011-216825 discloses a semiconductor device in which a diode region and an IGBT region are formed, and in which a lifetime controlled region is formed in a semiconductor layer of the diode region. The lifetime controlled region extends continuously in such a way that it enters a part of the IGBT region from a boundary between the diode region and the IGBT region. This document discloses that, according to the aforementioned structure, both an ON voltage and a reverse recovery charge (Qrr) are improved.

Japanese Unexamined Patent Application Publication No. 2016-082097 discloses an RC-IGBT including a plurality of dummy trenches and a grid-structured gate trench located between the plurality of dummy trenches. In a cell region surrounded by the grid-structured gate trench, an emitter region, a first anode region, a first barrier region, and a first pillar region are formed. The first pillar region is configured to extend along a thickness direction of a semiconductor substrate, be in contact with a front surface electrode, and be connected to the first barrier region. According to the aforementioned structure, a low ON voltage, a low gate capacitance, and a stable operation of a pn diode are achieved.

Japanese Unexamined Patent Application Publication No. 2015-165541 discloses a semiconductor device including a diode region and an IGBT region, in which the diode region includes a p-type anode region connected to an anode electrode by an Ohmic contact and a plurality of n-type pillar regions connected to the anode electrode by Schottky contacts. This document discloses that, by making an on-resistance of a first pillar region with respect to the anode electrode higher than an on-resistance of a second pillar region with respect to the anode electrode, gate interference can be suppressed.

Japanese Unexamined Patent Application Publication No. 2013-247248 discloses forming a field stop region by ion-implanting selenium into a rear surface of a semiconductor substrate, then selectively ion-implanting phosphorus and boron into the field stop region, to thereby form an n+ type region in a diode and form a p+ type region in an IGBT. This document discloses that, according to this manufacturing method, the breakdown voltage can be improved and the leakage current can be reduced.

Japanese Unexamined Patent Application Publication No. 2013-197306 discloses an RC-IGBT in which a first lifetime controlled region is formed on a collector side in an IGBT region, whereby the lifetime of carriers on an emitter side is made long and that on a collector side is made short, and a second lifetime controlled region is formed on an anode side in an FWD region, whereby the lifetime of carriers on an anode side is made short and that on a cathode side is made long. According to the aforementioned structure, the switching characteristic is improved.

Japanese Unexamined Patent Application Publication No. 2013-197122 discloses an RC-IGBT including an IGBT region having a base layer provided on one surface of a substrate and a diode region having an anode layer having a higher impurity count in a portion of the base layer. This document discloses that recovery characteristics of a diode and ohmic contact characteristics are improved by making the area occupied by the trench in the diode region different from the area occupied by the trench in the IGBT region.

SUMMARY

Due to a reason regarding the structure of the RC-IGBT, snapback becomes a problem in the RC-IGBT. Snapback means an increase in a saturation voltage between a collector and an emitter in the IGBT. When electrons flow into the n type cathode layer on the rear surface of the FWD adjacent to the IGBT, hole injection from the p type collector layer of the IGBT is suppressed, and conductivity modulation rarely occurs, which causes snapback to occur. When the saturation voltage increases due to the occurrence of snapback, IGBT characteristics and the like are degraded.

One embodiment has been made in order to solve the aforementioned problems and provides a semiconductor device, an RC-IGBT, and a method of manufacturing the semiconductor device capable of suppressing snapback.

The other problems and novel characteristics will be made apparent from the descriptions of the specification and the accompanying drawings.

According to one embodiment, a semiconductor device includes: a semiconductor substrate including a first principal surface and a second principal surface; an emitter electrode and a gate wiring provided in the first principal surface; and a collector electrode provided in the second principal surface. The semiconductor device includes a first unit cell region that is extended along one direction in a plane parallel to the first principal surface and a second unit cell region that is extended in the one direction when they are seen from the side of the first principal surface. The semiconductor substrate of the first unit cell region and the second unit cell region includes: a drift layer of a first conductive type; a hole barrier layer of a first conductive type that is provided to be closer to the first principal surface than the drift layer is and is extended in the one direction; a pair of trench electrodes that are provided in such a way as to sandwich the hole barrier layer from both sides thereof in another direction perpendicular to the one direction and are extended in the one direction; a body layer of a second conductive type that is provided to be closer to the first principal surface than the hole barrier layer is, is extended in the one direction, and is connected to the emitter electrode; an insulating film that is provided between the trench electrode, and the drift layer, the hole barrier layer, and the body layer; a field stop layer of a first conductive type provided to be closer to the second principal surface than the drift layer is; and a collector layer of a second conductive type that is provided to be closer to the second principal surface than the field stop layer is and is connected to the collector electrode. The trench electrode of the first unit cell region is connected to the gate wiring, and the trench electrode of the second unit cell region is connected to the emitter electrode. The semiconductor substrate of the second unit cell region includes a cathode layer of a first conductive type that is fitted into the collector layer, extended in the one direction, and connects the collector electrode and the field stop layer.

According to the embodiment, it is possible to provide a semiconductor device, an RC-IGBT, and a method of manufacturing the semiconductor device capable of suppressing snapback.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
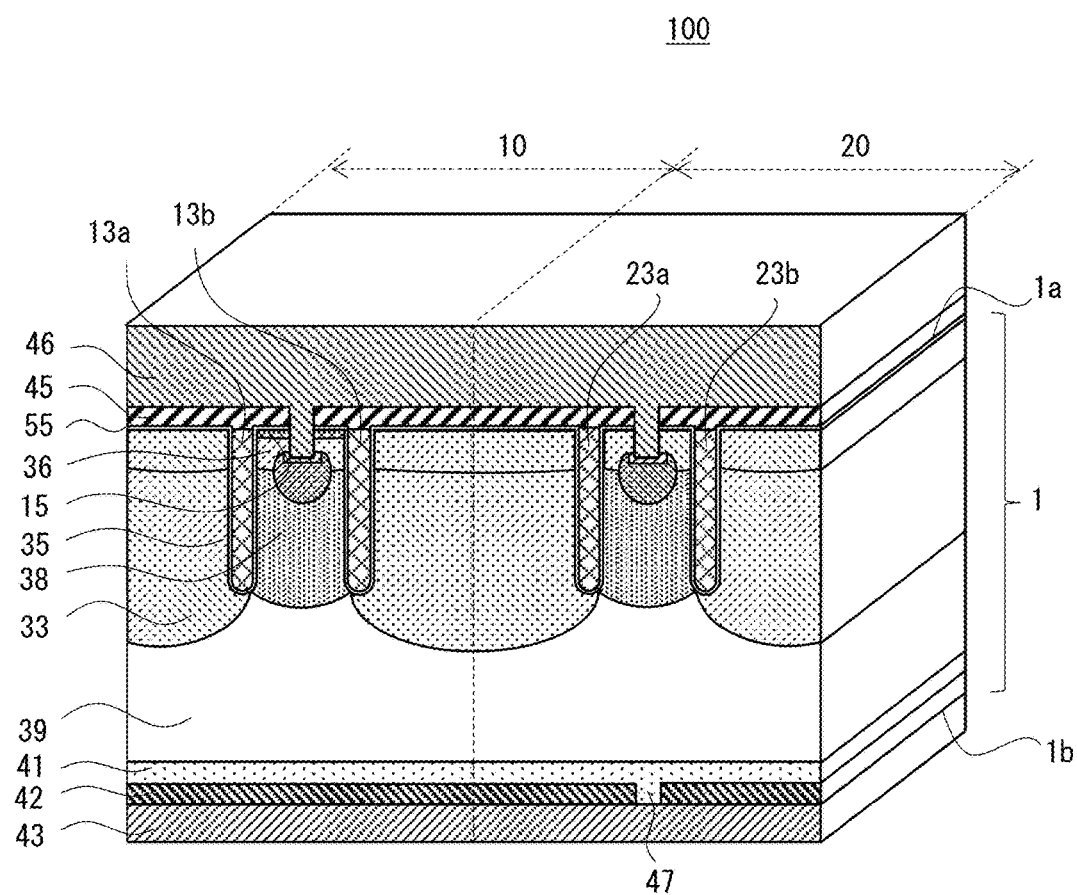
FIG. 1 is a perspective view exemplifying an outline of a semiconductor device according to an embodiment.

For the sake of clarification of descriptions, the following descriptions and the drawings are omitted and simplified as appropriate. Further, throughout the drawings, the same components are denoted by the same reference numerals and the overlapping descriptions will be omitted as necessary.

Embodiment

First, an outline of a semiconductor device according to an embodiment will be described. FIG. 1 is a perspective view exemplifying the outline of the semiconductor device according to the embodiment.

As shown in FIG. 1, a semiconductor device 100 includes a semiconductor substrate 1 including a front surface 1a (first principal surface) and a rear surface 1b (second principal surface), an emitter electrode 46 and a gate wiring (not shown) provided on the front surface 1a, and a collector electrode 43 provided on the rear surface. The semiconductor device 100 includes a first unit cell region 10 extending in one direction in the plane parallel to the front surface 1a and a second unit cell region 20 extending in one direction when they are seen from the front surface 1a.

The semiconductor substrate 1 of the first unit cell region 10 and the second unit cell region 20 includes an N− type drift layer 39, an N type hole barrier layer 38 that is provided to be closer to the front surface 1a than the N− type drift layer 39 is and is extended along one direction, a pair of trench electrodes 13a and 13b and a pair of trench electrodes 23a and 23b that are provided in such a way as to sandwich the N type hole barrier layer from both sides in another direction perpendicular to one direction and are extended along one direction, a P type body layer 36 that is provided to be closer to the front surface 1a than the N type hole barrier layer 38 is, is extended along one direction, and is connected to the emitter electrode 46, an insulating film 35 provided between the trench electrodes 13a and 13b, and the N− type drift layer 39, the N type hole barrier layer 38, and the P type body layer 36, an N type field stop layer 41 provided to be closer to the rear surface 1b than the N− type drift layer 39 is, and a P+ type collector layer 42 that is provided to be closer to the rear surface 1b than the N type field stop layer 41 is and is connected to the collector electrode 43.

Further, in the semiconductor device 100, the trench electrodes 13a and 13b of the first unit cell region 10 are connected to the gate wiring (not shown), the trench electrodes 23a and 23b of the second unit cell region 20 are connected to the emitter electrode 46, the semiconductor substrate 1 of the second unit cell region 20 includes an N type cathode layer 47 that is fitted into the P+ type collector layer 42, extended along one direction, and connects the collector electrode 43 and the N type field stop layer 41.

The semiconductor device 100 is, for example, an RC-IGBT in which the first unit cell region 10 that functions as the IGBT and the second unit cell region 20 that functions as the FWD are formed in one chip.

Figure 2:
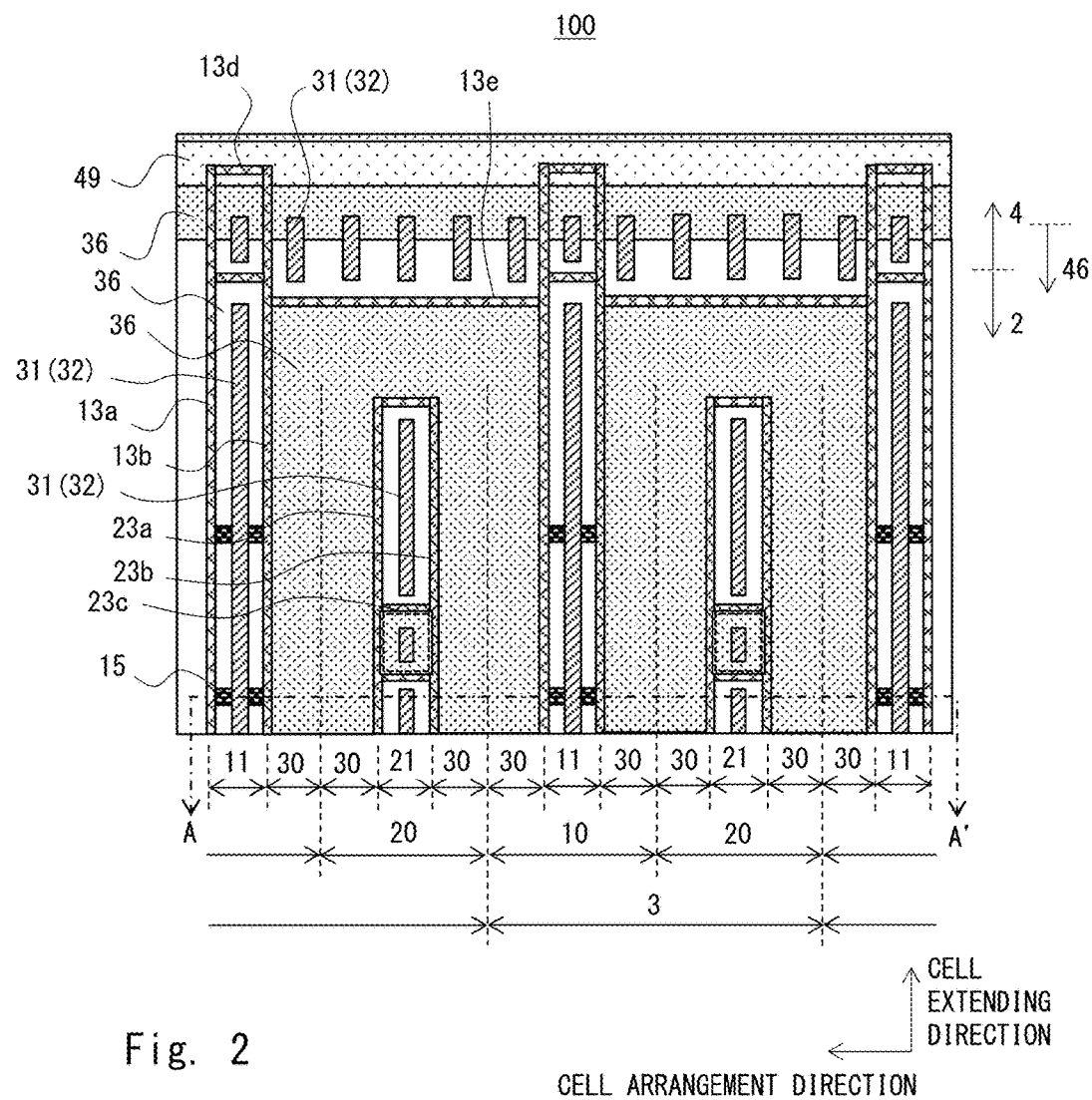
FIG. 2 is a plan view exemplifying the semiconductor device according to the embodiment.
Figure 3:
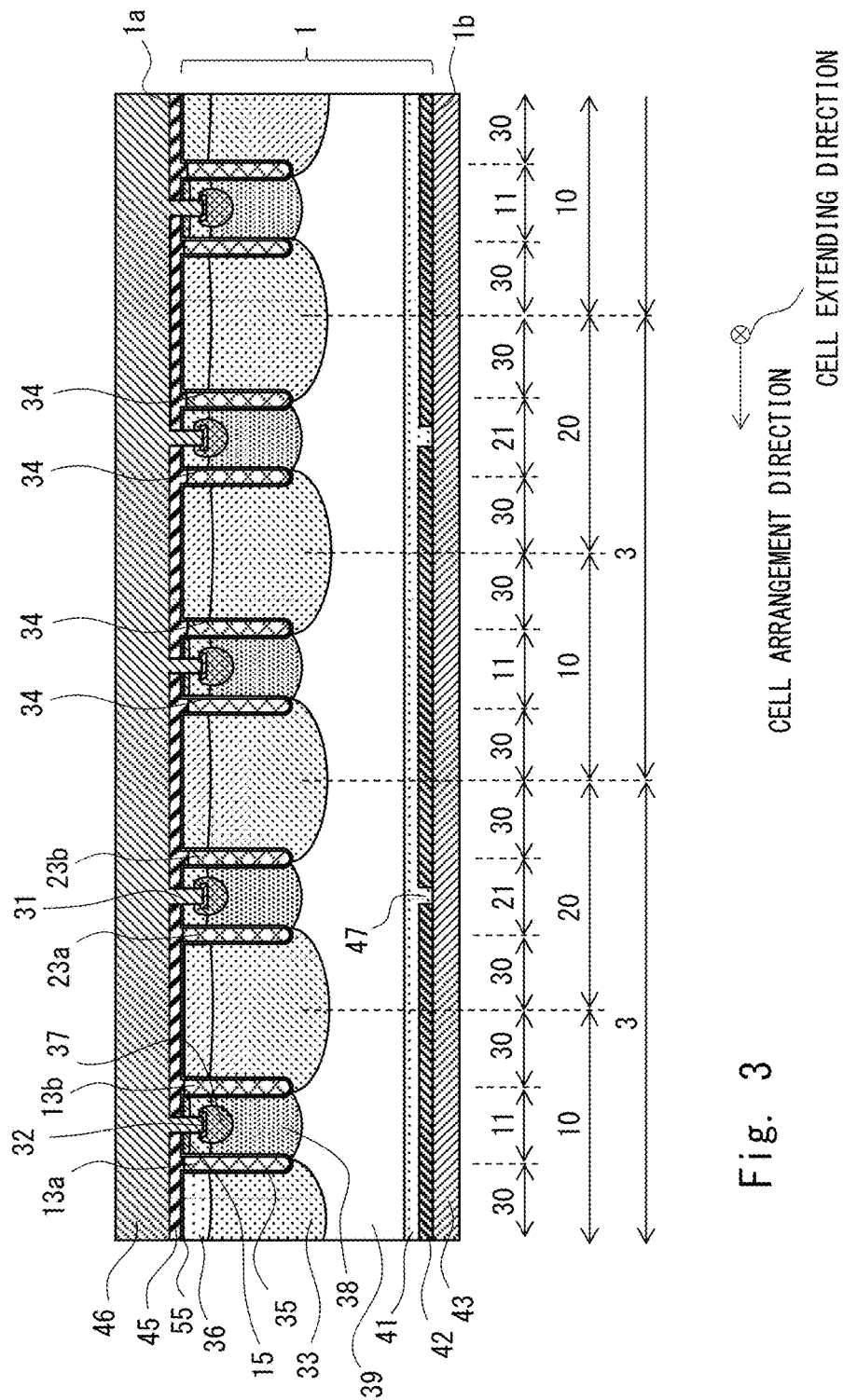
FIG. 3 is a cross-sectional view exemplifying the semiconductor device according to the embodiment and is a cross-sectional view taken along the line A-A' of FIG. 2.

Next, the details of the semiconductor device 100 according to this embodiment will be described. FIG. 2 is a plan view exemplifying the semiconductor device 100 according to this embodiment. FIG. 3 is a cross-sectional view exemplifying the semiconductor device 100 according to this embodiment and is a cross-sectional view taken along the line A-A' of FIG. 2. In FIG. 2, the emitter electrode 46 and an inter-layer insulating film 45 on the side of the front surface 1a are omitted.

As shown in FIGS. 2 and 3, the semiconductor device 100 is provided in the semiconductor substrate 1. The semiconductor substrate 1 includes the front surface 1a (the first principal surface) and the rear surface 1b (the second principal surface). The front surface 1a of the semiconductor substrate 1 is provided with the emitter electrode 46 (shown by the arrow in FIG. 2) and a gate wiring 49. The semiconductor substrate 1 is provided with a cell region 2 (shown by the arrow in FIG. 2). The cell region 2 is provided with a plurality of unit cell regions 3 that are extended along one direction in the plane parallel to the front surface 1a when it is seen from the front surface 1a. One direction in which the unit cell region 3 is extended is referred to as a cell extending direction. The plane parallel to the front surface 1a includes not only the plane completely parallel thereto but also a plane parallel thereto including an error in terms of a process technique.

The plurality of unit cell regions 3 are periodically arranged in the other direction that crosses the cell extending direction (e.g., the other direction that is perpendicular to the cell extending direction). The direction in which the unit cell regions 3 are arranged is referred to as a cell arrangement direction.

The unit cell region 3 is formed of the first unit cell region 10 and the second unit cell region 20. Accordingly, the first unit cell region 10 and the second unit cell region 20 extend along the cell extending direction. Further, in the cell arrangement direction, the first unit cell regions 10 and the second unit cell regions 20 are alternately arranged. Further, the first unit cell region 10 and the second unit cell region 20 have, for example, the same length in the cell arrangement direction. In the cell arrangement direction, the first unit cell region 10 and the second unit cell region 20 may have lengths different from each other.

Each of the first unit cell regions 10 includes a central FET region 11 and floating regions 30 surrounding the FET region 11. The FET region 11 and the floating regions 30 include parts that are extended along the cell extending direction. The trench electrodes 13a and 13b electrically connected to the gate wiring 49 are provided between the FET region 11 and the floating regions 30. The trench electrodes 13a and 13b also include parts that are extended along the cell extending direction.

Each of the second unit cell regions 20 includes a central dummy cell region 21 and floating regions 30 surrounding the dummy cell region 21. The dummy cell region 21 and the floating regions include parts that are extended along the cell extending direction. The trench electrodes 23a and 23b electrically connected to the emitter electrode 46 are provided between the dummy cell region 21 and the floating regions 30. The trench electrodes 23a and 23b also have parts that are extended along the cell extending direction.

A contact groove 31 that is extended along the cell extending direction is provided in each of the central part of the FET region 11 and the central part of the dummy cell region 21. The contact grooves 31 are formed in the semiconductor substrate 1. A P+ type body contact layer 32 is provided on the bottom surface of the contact groove 31. That is, the P+ type body contact layer 32 is provided in the semiconductor substrate 1 that constitutes the bottom surface of the contact groove 31. Note that P+ type indicates a low-resistance P type.

Note that N+ type indicates a low-resistance N type, and P− type and N− type respectively indicate a high-resistance P type and a high-resistance N type. Further, the P type and the N type respectively indicate a P type and an N type having a resistance between the low resistance and the high resistance. The same is applicable to the following description, unless otherwise specified. The N type may be called a first conductive type and the P type may be called a second conductive type, and vice versa.

In the FET region 11, N+ type emitter layers 15 are periodically formed in the cell extending direction. Accordingly, the N+ type emitter layers 15 and the regions in which N type impurities are not introduced (P type body layers 36) are alternately formed along the cell extending direction in the FET region 11.

In the dummy cell region 21, coupling trench electrodes 23c that mutually connect the trench electrodes 23a and 23b are periodically provided in the cell extending direction. The coupling trench electrodes 23c are mutually connected by the part crossing the contact grooves 31. That is, the coupling trench electrode 23c and the contact groove 31 are substantially perpendicular to each other when they are seen from the front surface 1a. By the mutual connection between the coupling trench electrode 23c and the P+ type body contact layer 32, the trench electrodes 23a and 23b are electrically connected to the emitter electrode 46.

In this example, the width of the dummy cell region 21 and the width of the FET region 11, that is, the length of the dummy cell region 21 in the cell arrangement direction and the length of the FET region 11 in the cell arrangement direction are substantially equal to each other. In this way, by making the width of the dummy cell region 21 substantially equal to the width of the FET region 11, the hole distribution can be made uniform.

In a part on the front surface 1a of the semiconductor substrate 1 in the floating region 30, a P type floating layer 33 and the P type body layer 36 are provided.

A cell peripheral junction region 4 (shown by the arrow in FIG. 2) is provided in the outer peripheral part of the cell region 2. The P type body layer 36 is provided in apart close to the front surface 1a of the semiconductor substrate 1 in the cell peripheral junction region 4. The P type body layer 36 is electrically connected to the emitter electrode 46 via the P+ type body contact layer 32 and the contact groove 31.

The gate wiring 49 is, for example, provided in the cell peripheral junction region 4. The trench electrodes 13a and 13b are extended to the cell peripheral junction region 4 from the cell region 2. The end parts of the trench electrodes 13a and 13b are connected to the gate wiring 49 by a trench gate electrode 13d that couples the respective end parts in the cell peripheral junction region 4. The P type body layer 36 and the cell peripheral junction region 4 are separated from each other by an end part trench gate electrode 13e.

As shown in FIG. 3, the semiconductor substrate 1 in which the semiconductor device 100 is provided includes an N− type drift layer 39. In the description regarding FIG. 3, for the sake of convenience of explanation of the semiconductor device 100, the direction from the rear surface 1b to the front surface 1a of the semiconductor substrate 1 may be called above and the direction from the front surface 1a to the rear surface 1b may be called below. This direction is introduced only for the sake of the explanation and the actual semiconductor device 100 may not be used with the front surface 1a being directed upward.

In the first unit cell region 10, trenches 34 are provided on the front surface 1a of the semiconductor substrate 1 in the boundaries between the FET region 11 and the floating regions 30. The trench electrodes 13a and 13b are provided via the insulating film 35 inside each of the trenches 34. The trench electrodes 13a and 13b of the first unit cell region 10 are connected to the gate wiring 49.

In the second unit cell region 20, trenches 34 are provided on the front surface 1a of the semiconductor substrate 1 in the boundaries between the dummy cell region 21 and the floating regions 30. The trench electrodes 23a and 23b are provided via the insulating film 35 inside each of the trenches 34. The trench electrodes 23a and 23b of the second unit cell region 20 are connected to the emitter electrode 46.

In the semiconductor substrate 1 of the first unit cell region 10, the N type hole barrier layer 38 that is extended along the cell extending direction is provided to be closer to the front surface 1a than the N− type drift layer 39 is. Further, the pair of trench electrodes 13a and 13b is provided in such a way as to hold the N type hole barrier layer 38 from the respective sides in the cell arrangement direction. The trench electrodes 13a and 13b are extended along the cell extending direction. The P type body layer 36 that is extended along the cell extending direction is provided between the pair of trench electrodes 13a and 13b, the P type body layer 36 being provided to be closer to the front surface 1a than the N type hole barrier layer 38 is. Further, the N+ type emitter layer 15 is selectively provided between the pair of trench electrodes 13a and 13b, the N+ type emitter layer 15 being provided to be closer to the front surface 1a than the P type body layer 36 is.

In the semiconductor substrate 1 of the floating region 30 of the first unit cell region 10, the P type floating layer 33 that is extended along the cell extending direction is provided to be closer to the front surface 1a than the N− type drift layer 39 is. Further, the P type body layer 36 is provided to be closer to the front surface 1a than the P type floating layer 33 is. Therefore, the trench electrodes 13a and 13b are provided between the N type hole barrier layer 38 and the P type body layer 36, and the P type floating layer 33 and the P type body layer 36. By providing the P type floating layer 33, the width of the dummy cell region 21 can be increased without causing a sudden decrease in the breakdown voltage. It is therefore possible to enhance the hole storage effect.

The lower end of the P type floating layer 33 is made deeper than the lower end of the trench electrodes 13a and 13b. In this way, by making the depth of the P type floating layer 33 from the front surface 1a larger than that of the lower end of the trench electrodes 13a and 13b, even when the width of the floating region 30 is made larger than the width of the FET region 11, it becomes easy to maintain the breakdown voltage. It is therefore possible to improve the IE effects.

The insulating film 35 is provided between the trench electrodes 13a and 13b, and the N-drift layer 39, the N type hole barrier layer 38, the P type body layer 36, the P type floating layer 33, and the N+ type emitter layer 15.

In the first unit cell region 10, the inter-layer insulating film 45 is provided on the semiconductor substrate 1. Accordingly, the inter-layer insulating film 45 is provided on the P type body layer 36 in the FET region 11 and the floating region 30. Further, the inter-layer insulating film 45 is provided on the trench electrodes 13a and 13b.

The contact groove 31 is provided between the trench electrodes 13a and 13b in such a way that it extends in the cell extending direction. The contact groove 31 penetrates through the inter-layer insulating film 45 and the N+ type emitter layer 15 and reaches the P type body layer 36. In the part in which the N+ type emitter layer 15 is not provided, the contact groove 31 penetrates through the inter-layer insulating film 45 and reaches the P type body layer 36.

The P+ type body contact layer 32 is provided on the bottom surface of the contact groove 31. The emitter electrode 46 is connected to the P type body layer 36 via the contact groove 31 and the P+ type body contact layer 32. A P+ type latch-up prevention layer 37 is provided below the contact groove 31 and the P+ type body contact layer 32. Therefore, the P+ type body contact layer 32 is provided between the emitter electrode 46 and the P+ type latch-up prevention layer 37. The N type hole barrier layer 38 is provided below the P type body layer 36 and the P+ type latch-up prevention layer 37.

The N− type drift layer 39 is provided below the N type hole barrier layer 38, that is, in a part close to the rear surface 1b. Accordingly, the N type hole barrier layer 38, the P+ type latch-up prevention layer 37, the P type body layer 36, the P+ type body contact layer 32, and the N+ type emitter layer 15 are provided above the N− type drift layer 39.

In the semiconductor substrate 1 of the first unit cell region 10, the N type field stop layer 41 is provided to be closer to the rear surface 1b than the N− type drift layer 39 is. The P+ type collector layer 42 is provided to be closer to the rear surface 1b than the N type field stop layer 41 is. The P+ type collector layer 42 is connected to the collector electrode 43.

The impurity doped structure in the semiconductor substrate 1 of the second unit cell region 20 is the same as the structure of the first unit cell region 10 except that the N+ type emitter layer 15 is not provided, for example, above the N− type drift layer 39. On the other hand, the semiconductor substrate 1 of the second unit cell region 20 is the same as the structure of the first unit cell region 10 in that the N type field stop layer 41 and the P+ type collector layer 42 are provided below the N− type drift layer 39. However, the semiconductor substrate 1 of the second unit cell region 20 includes the N type cathode layer 47. The N type cathode layer 47 is provided to be closer to the rear surface 1b than the N type field stop layer 41 is.

The N type cathode layer 47 is fitted into the collector layer 42, is extended along the cell extending direction, and connects the collector electrode 43 and the field stop layer 41. The N type cathode layer 47 is provided at the center of the collector layer 42 in the dummy cell region 21. That is, the N type cathode layer 47 is provided along a line that passes the center of the second unit cell region 20 in the cell arrangement direction. The length of the N type cathode layer 47 in the cell arrangement direction is smaller than the length of the N type hole barrier layer 38 in the cell arrangement direction of the second unit cell region 20. Further, when the trench electrodes 23a and 23b in the second unit cell region 20 are projected in the direction toward the rear surface 1b from the front surface 1a, the N type cathode layer 47 is formed in the region surrounded by the trench electrodes 23a and 23b projected onto the P+ type collector layer 42.

According to the aforementioned structure, it is possible to suppress electrons injected from the FET region 11 on the side of the front surface 1a from diffusing laterally and flowing into the N type cathode layer 47 on the rear surface 1b, to thereby suppress snapback.

The plurality of first unit cell regions 10 and the plurality of second unit cell regions 20 are alternately provided in the cell arrangement direction. The plurality of second unit cell regions 20 may include the second unit cell region 20 in which the N type cathode layer 47 is provided and the second unit cell region 20 in which the N type cathode layer 47 is not provided. Further, in the plurality of second unit cell regions 20, the second unit cell regions 20 in which the N type cathode layers 47 are provided may be periodically arranged. According to the aforementioned structure, it is possible to adjust the number of second unit cell regions 20 that function as the FWD and to optimize the characteristics of the RC-IGBT.

While the N type hole barrier layer 38 and the P+ type latch-up prevention layer 37 are provided in the FET region 11 and the dummy cell region 21, these components may be omitted. However, by providing the N type hole barrier layer 38 and the P+ type latch-up prevention layer 37, the balance of flow of holes can be maintained as a whole.

In order to exemplify the structure of the semiconductor device 100 more specifically, one example of the main dimensions of the respective regions and the respective layers is shown. That is, the width of the FET region 11 is about 1.3 micrometers. The total width of the two floating regions 30 between the FET region 11 and the dummy cell region 21 is about 3.3 micrometers.

The width of the contact groove 31 is about 0.3 micrometers. The width of the trench 34 is about 0.7 micrometers, and preferably 0.8 micrometers or smaller. The depth of the trench 34 is about 3 micrometers.

The depth of the N+ type emitter layer 15 is about 250 nm, the depth of the P type body layer 36 is about 0.8 micrometers, the depth of the P+ type latch-up prevention layer 37 is about 1.4 micrometers, the depth of the P type floating layer 33 is about 4.5 micrometers, the thickness of the N type field stop layer 41 is about 1.5 micrometers, the thickness of the P+ type collector layer 42 is about 0.5 micrometers, and the thickness of the semiconductor substrate 1 is about 70 micrometers (in this example, the breakdown voltage is about 600 volts).

The thickness of the semiconductor substrate 1 strongly depends on the required breakdown voltage. Therefore, in the breakdown voltage of 1200 volts, the thickness of the semiconductor substrate 1 is, for example, about 120 micrometers and in the breakdown voltage of 400 volts, the thickness of the semiconductor substrate 1 is, for example, about 40 micrometers.

Next, a method of manufacturing the semiconductor device according to this embodiment will be described.

Figure 4:
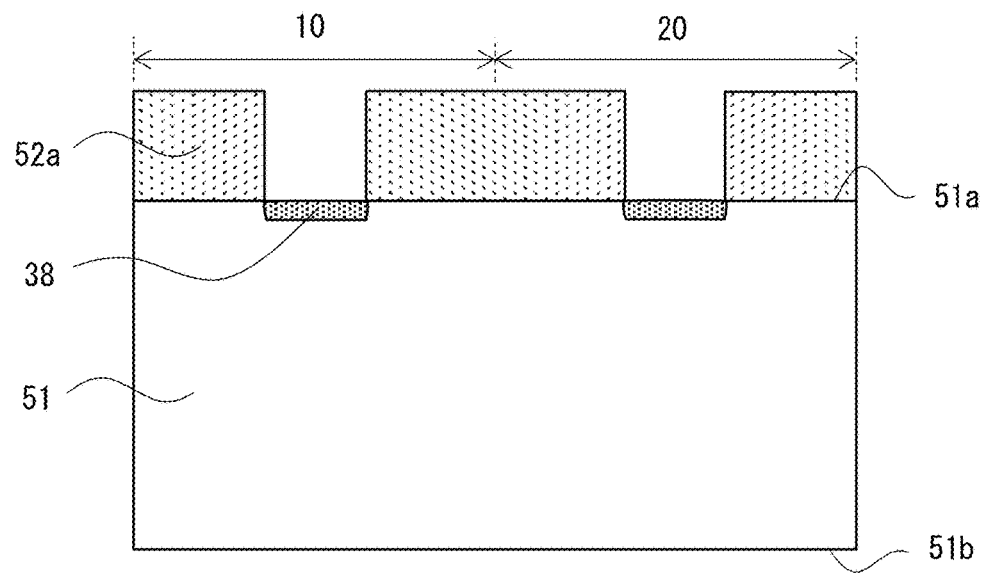
FIG. 4 is a cross-sectional view exemplifying a method of manufacturing the semiconductor device according to this embodiment and shows a process of forming an N type hole barrier layer.
Figure 5:
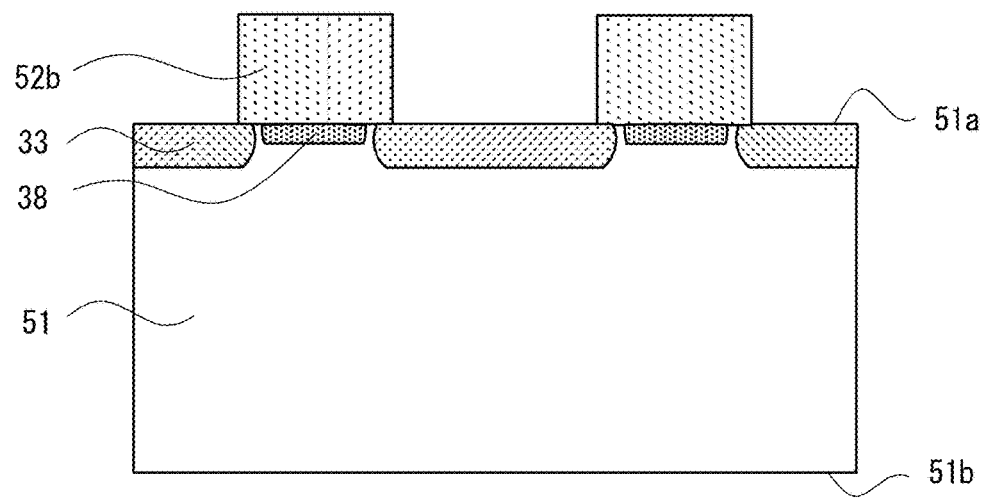
FIG. 5 is a cross-sectional view exemplifying the method of manufacturing the semiconductor device according to this embodiment and shows a process of forming a P type floating layer.
Figure 6:
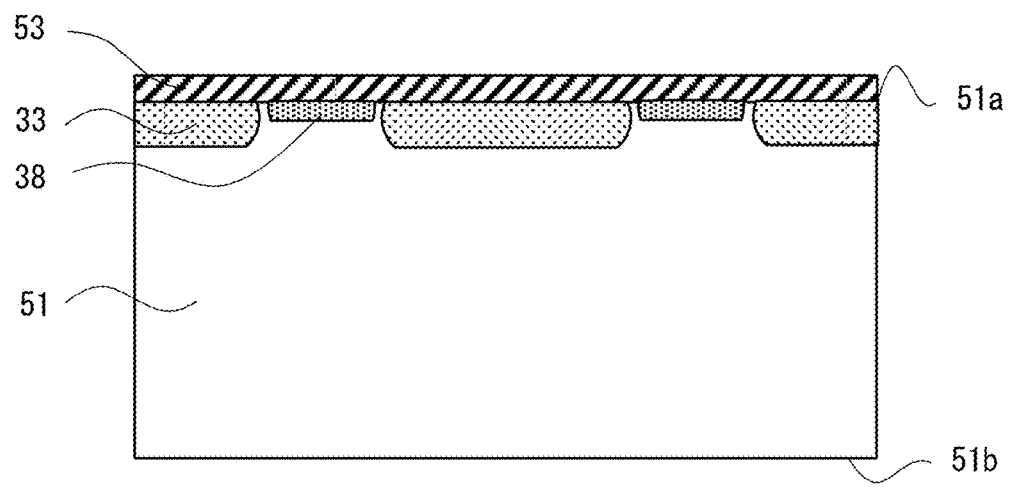
FIG. 6 is a cross-sectional view exemplifying the method of manufacturing the semiconductor device according to this embodiment and shows a process of forming a hard mask.
Figure 7:
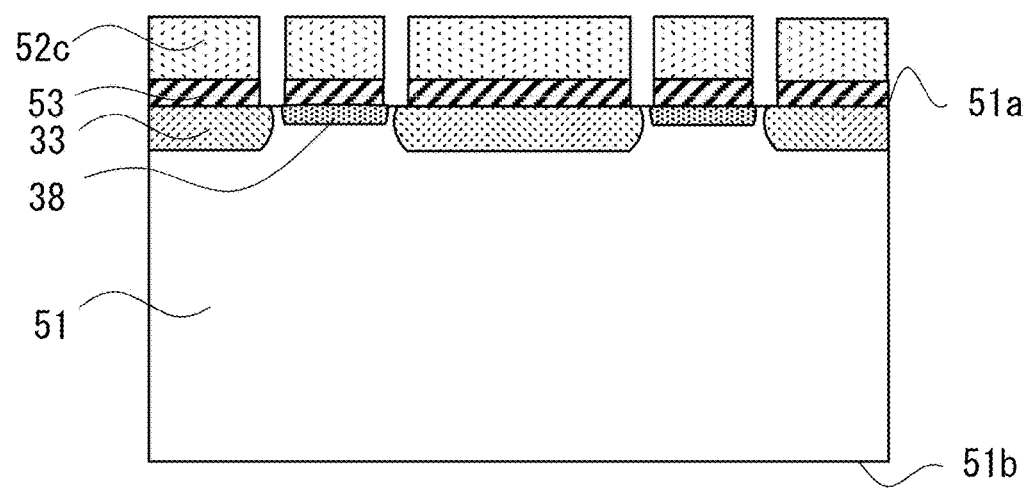
FIG. 7 is a cross-sectional view exemplifying the method of manufacturing the semiconductor device according to this embodiment and shows patterning of the hard mask.
Figure 8:
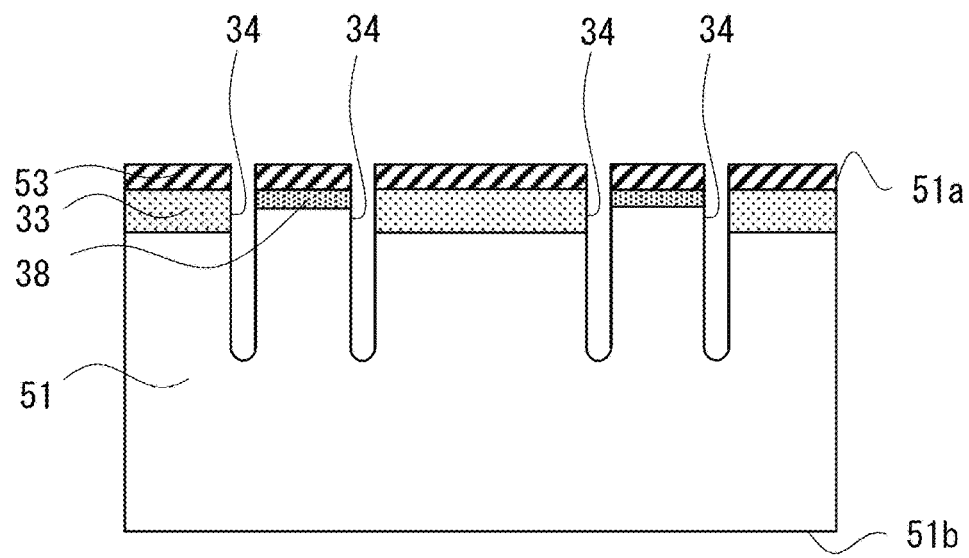
FIG. 8 is a cross-sectional view exemplifying the method of manufacturing the semiconductor device according to the embodiment and shows a process of forming trenches.
Figure 9:
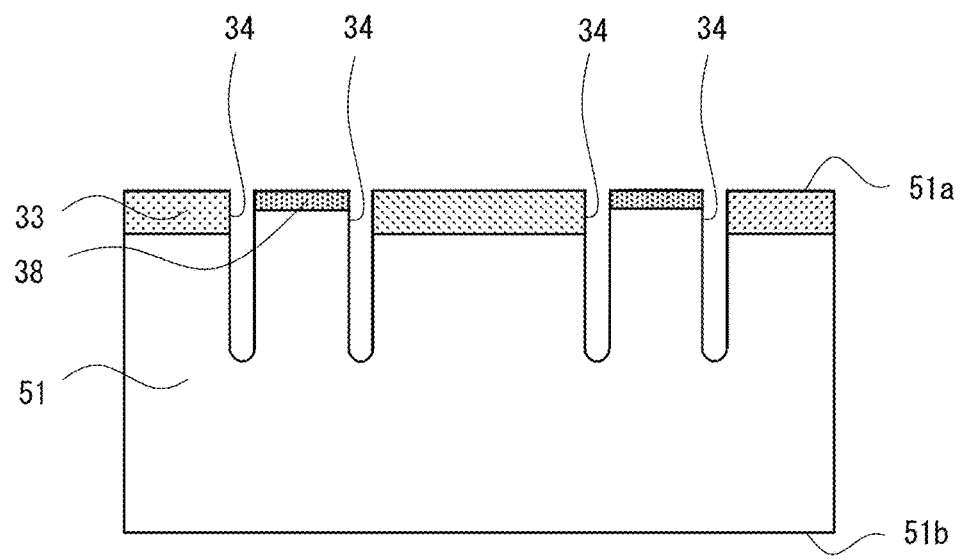
FIG. 9 is a cross-sectional view exemplifying the method of manufacturing the semiconductor device according to the embodiment and shows a process of removing a hard mask.
Figure 10:
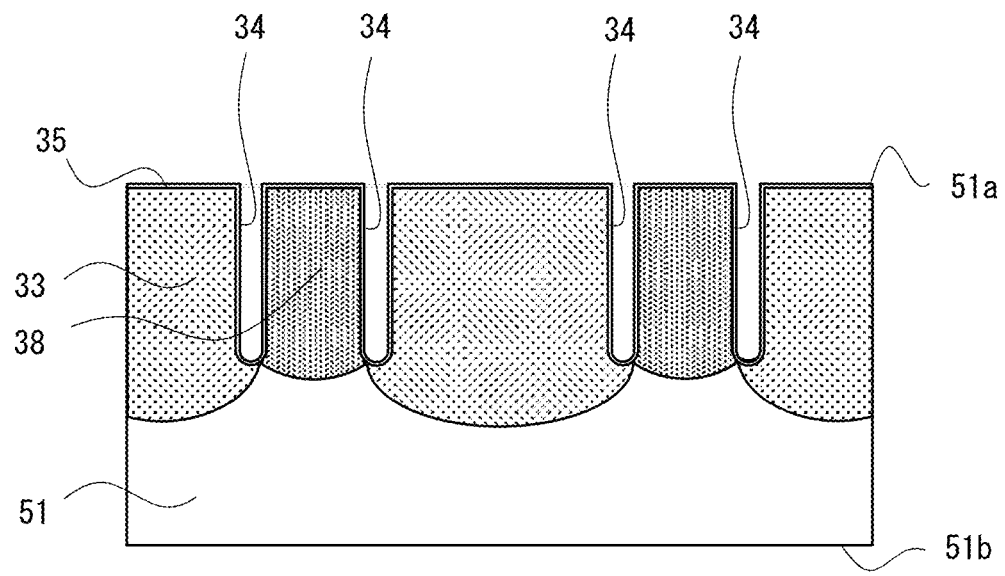
FIG. 10 is a cross-sectional view exemplifying the method of manufacturing the semiconductor device according to the embodiment and shows a process of forming an insulating film.
Figure 11:
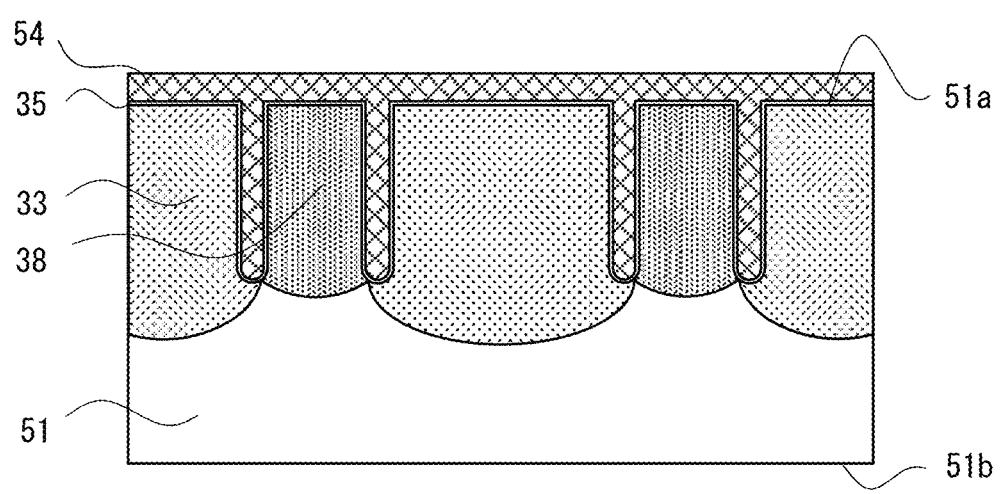
FIG. 11 is a cross-sectional view exemplifying the method of manufacturing the semiconductor device according to the embodiment and shows a process of depositing polysilicon for forming trench electrodes.
Figure 12:
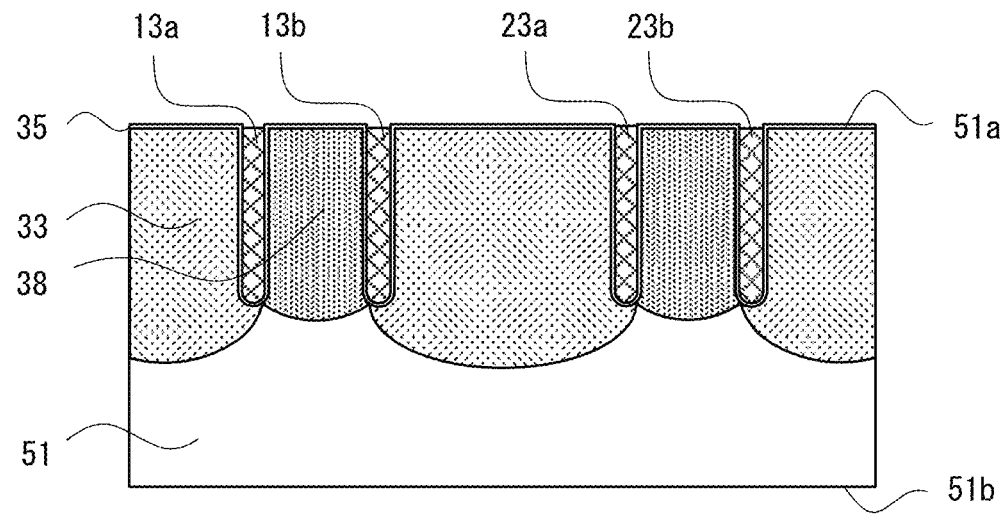
FIG. 12 is a cross-sectional view exemplifying the method of manufacturing the semiconductor device according to the embodiment and shows a process of etching back polysilicon for forming the trench electrodes.
Figure 13:
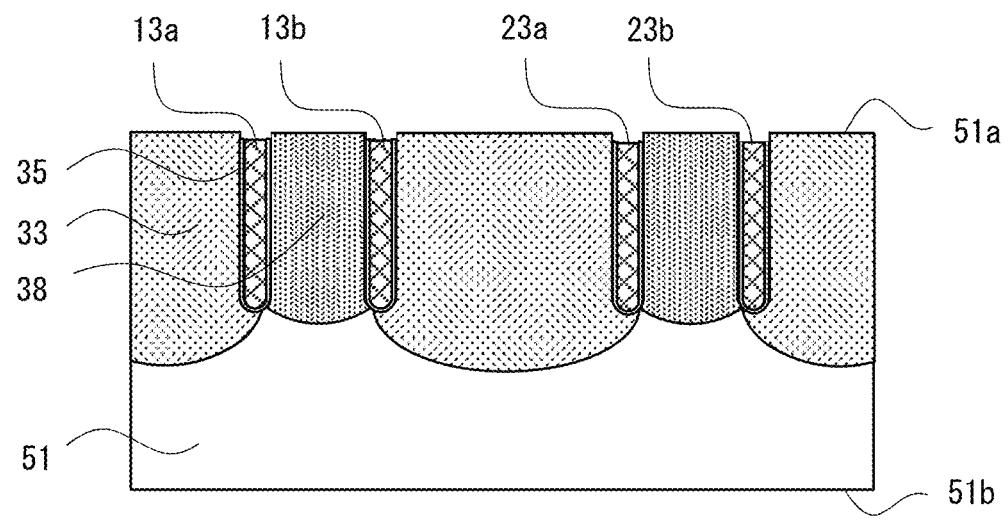
FIG. 13 is a cross-sectional view exemplifying the method of manufacturing the semiconductor device according to the embodiment and shows a process of etching back the insulating film for forming the trench electrodes.
Figure 14:
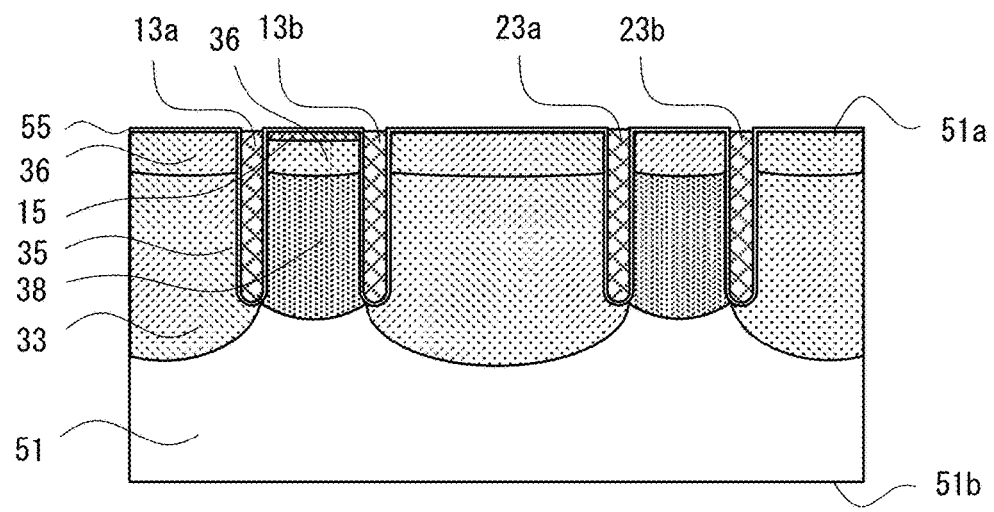
FIG. 14 is a cross-sectional view exemplifying the method of manufacturing the semiconductor device according to the embodiment and shows a process of forming a P type body layer and an N+ type emitter layer.
Figure 15:
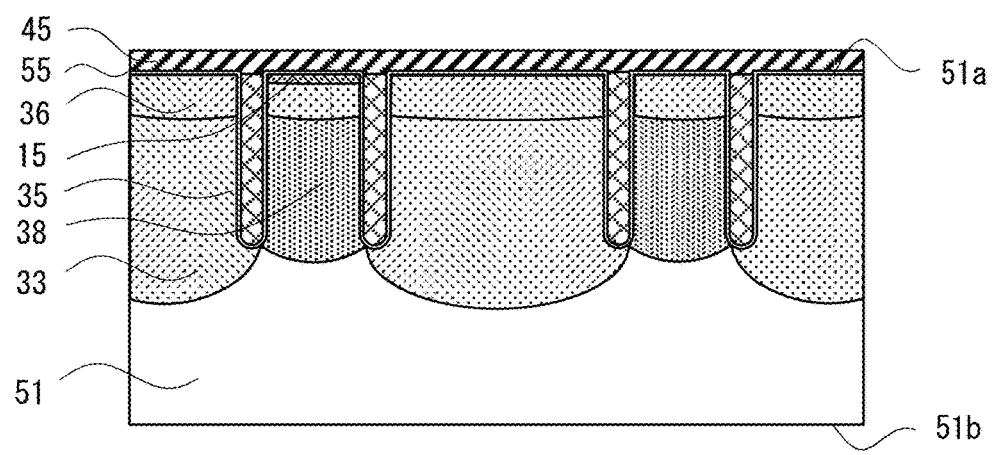
FIG. 15 is a cross-sectional view exemplifying the method of manufacturing the semiconductor device according to the embodiment and shows a process of forming an inter-layer insulating film.
Figure 16:
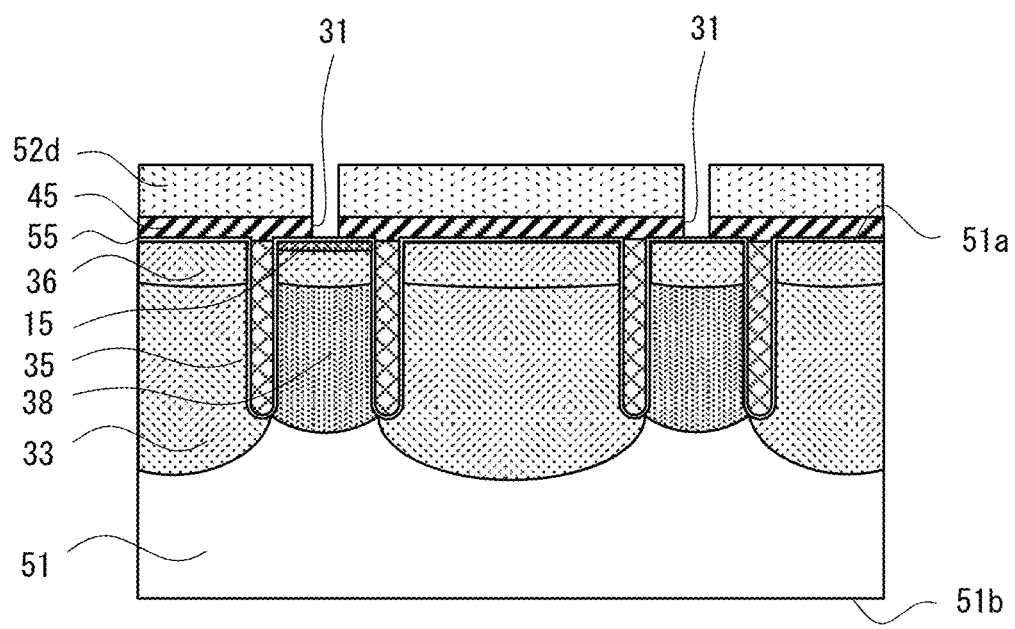
FIG. 16 is a cross-sectional view exemplifying the method of manufacturing the semiconductor device according to the embodiment and shows a process of patterning the inter-layer insulating film.
Figure 17:
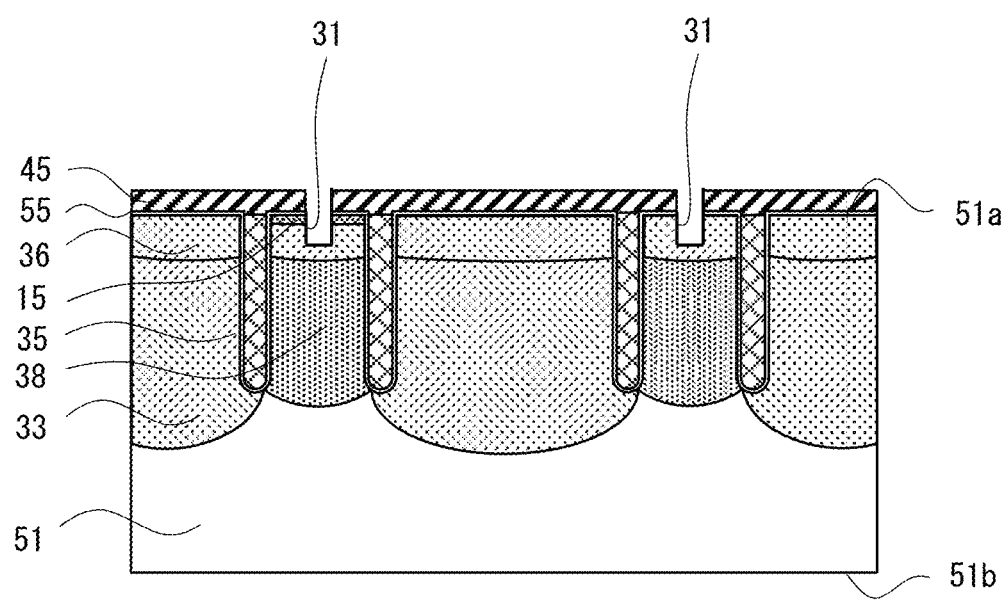
FIG. 17 is a cross-sectional view exemplifying the method of manufacturing the semiconductor device according to the embodiment and shows a process of forming contact grooves.
Figure 18:
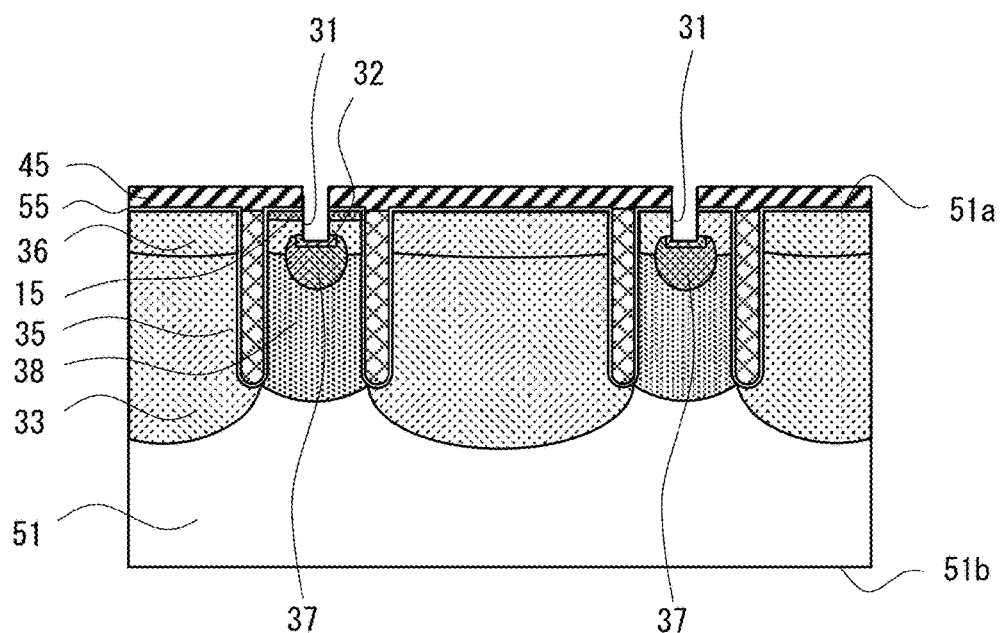
FIG. 18 is a cross-sectional view exemplifying the method of manufacturing the semiconductor device according to the embodiment and shows a process of forming a P+ type latch-up prevention layer and a P+ type body contact layer.
Figure 19:
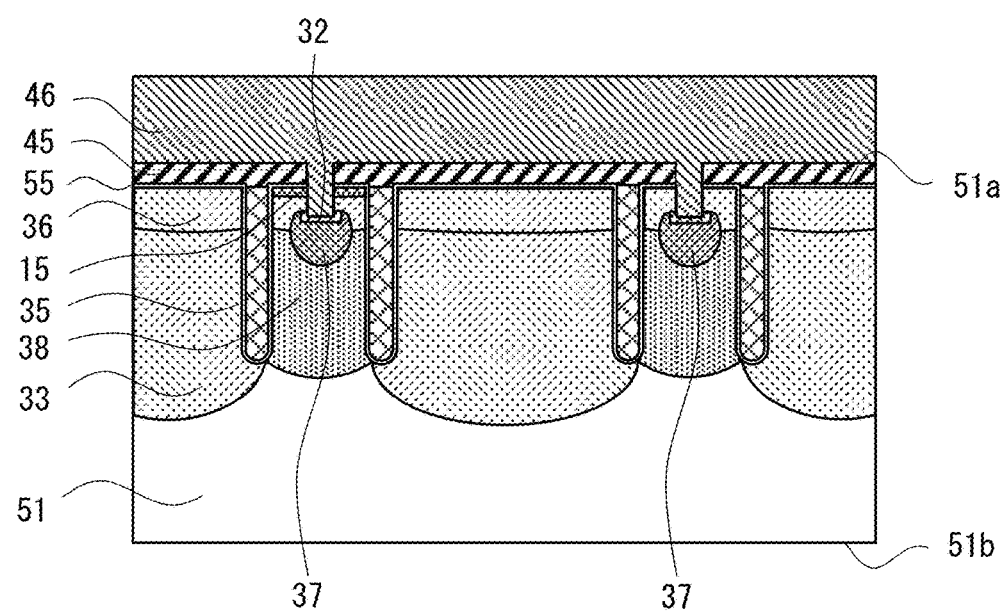
FIG. 19 is a cross-sectional view exemplifying the method of manufacturing the semiconductor device according to the embodiment and shows a process of forming an emitter electrode.
Figure 20:
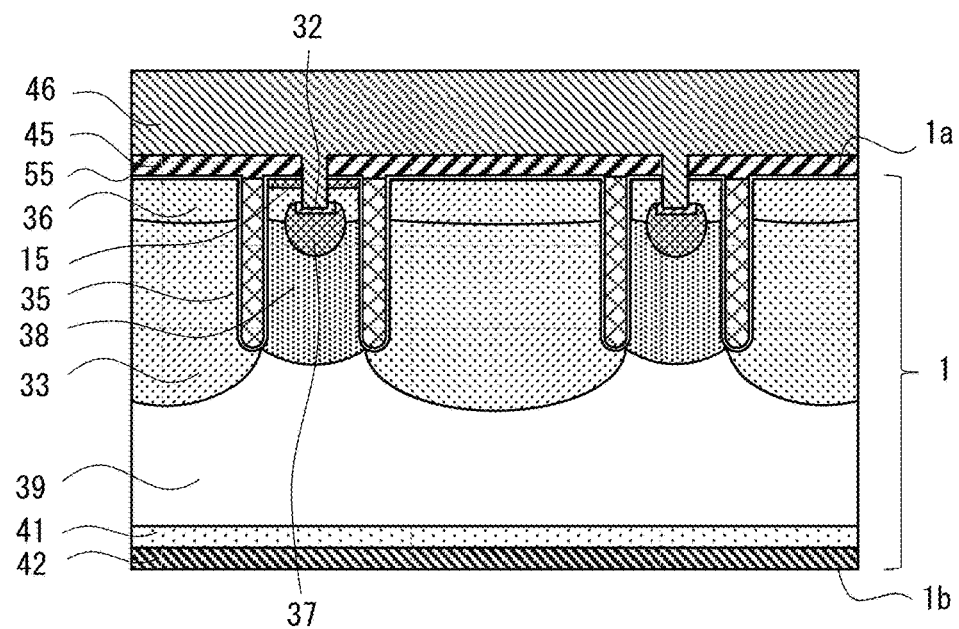
FIG. 20 is a cross-sectional view exemplifying the method of manufacturing the semiconductor device according to the embodiment and shows a process of forming an N type field stop layer and a P+ type collector layer.
Figure 21:
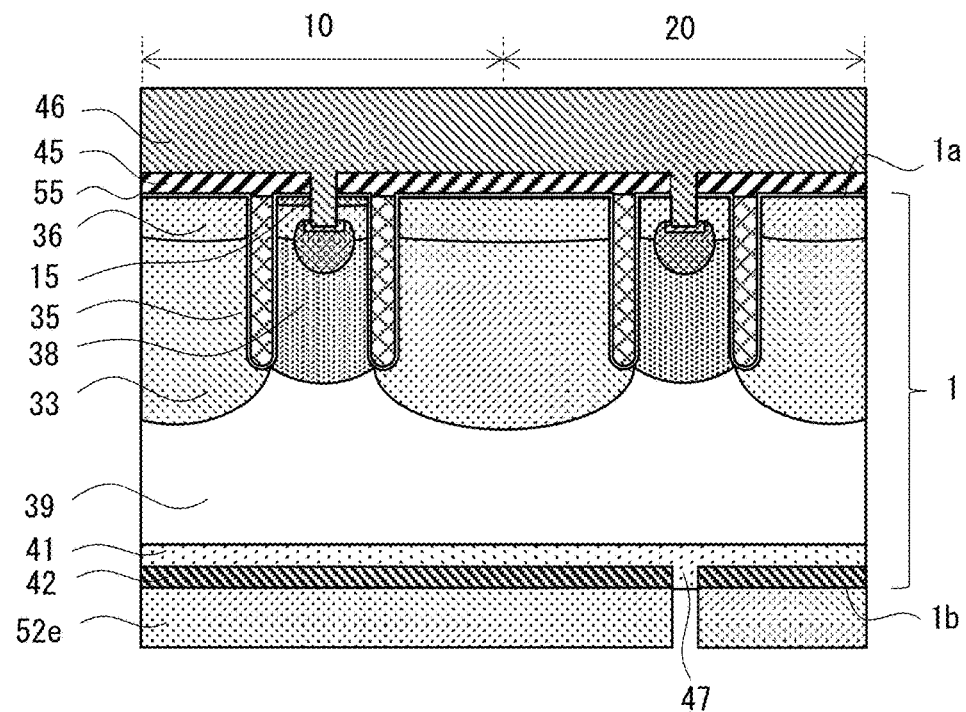
FIG. 21 is a cross-sectional view exemplifying the method of manufacturing the semiconductor device according to the embodiment and shows a process of forming an N type cathode layer.
Figure 22:
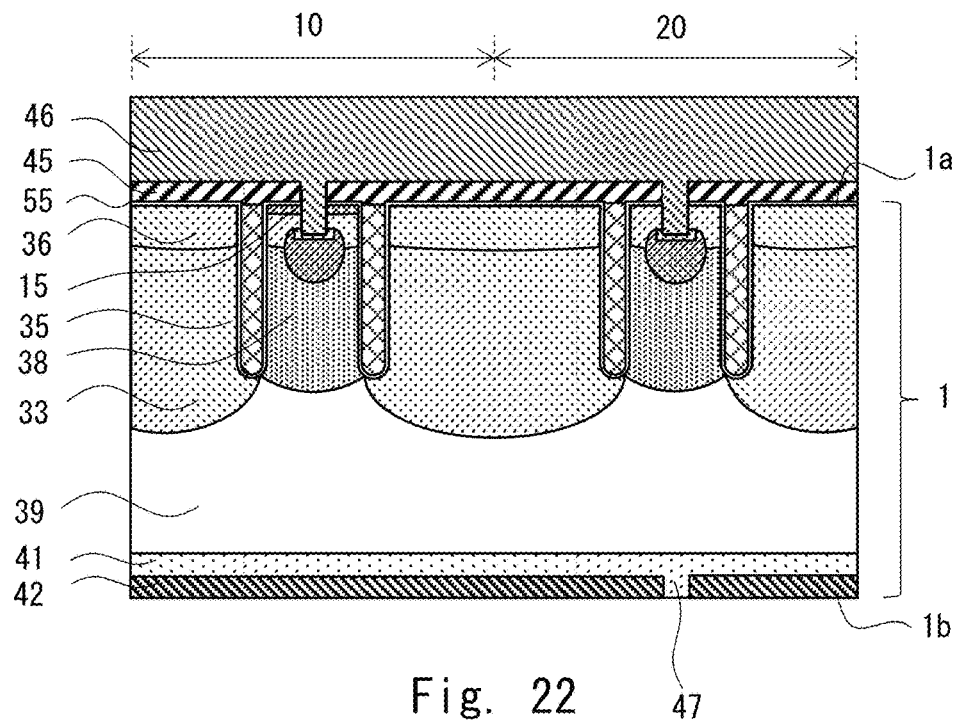
FIG. 22 is a cross-sectional view exemplifying the method of manufacturing the semiconductor device according to the embodiment and shows a process of removing a resist film in the process of forming the N type cathode layer.
Figure 23:
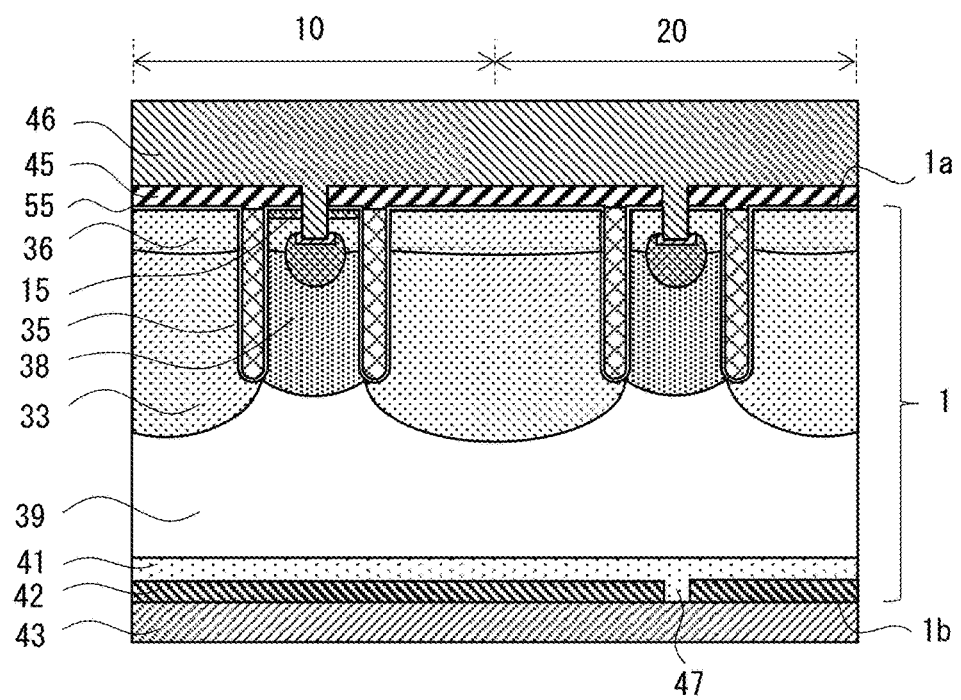
FIG. 23 is a cross-sectional view exemplifying the method of manufacturing the semiconductor device according to the embodiment and shows a process of forming a collector electrode.

FIGS. 4 to 23 are cross-sectional views exemplifying the method of manufacturing the semiconductor device according to the embodiment. FIG. 4 shows a process of forming the N type hole barrier layer. FIG. 5 shows a process of forming the P type floating layer. FIG. 6 shows a process of forming the hard mask. FIG. 7 shows patterning of the hard mask. FIG. 8 shows a process of forming the trenches. FIG. 9 shows a process of removing the hard mask. FIG. 10 shows a process of forming the insulating film. FIG. 11 shows a process of depositing polysilicon for forming the trench electrodes. FIG. 12 shows a process of etching back polysilicon for forming the trench electrodes. FIG. 13 shows a process of etching back the insulating film for forming the trench electrodes. FIG. 14 shows a process of forming the P type body layer and the N+ type emitter layer. FIG. 15 shows a process of forming the inter-layer insulating film. FIG. 16 shows a process of patterning the inter-layer insulating film. FIG. 17 shows a process of forming the contact grooves. FIG. 18 shows a process of forming the P+ type latch-up prevention layer and the P+ type body contact layer. FIG. 19 shows a process of forming the emitter electrode. FIG. 20 shows a process of forming the N type field stop layer and the P+ type collector layer. FIG. 21 shows a process of forming the N type cathode layer. FIG. 22 shows a process of removing the resist film in the process of forming the N type cathode layer. FIG. 23 shows a process of forming the collector electrode.

First, an N− type silicon single crystal wafer 51 is, for example, prepared as the semiconductor substrate 1 including the front surface 1a and the rear surface 1b. The phosphorus concentration is about $2\times10^{14}/cm^3$. The wafer 51 is not limited to being made of silicon and may be made of another semiconductor material.

As shown in FIG. 4, the first cell unit region 10 and the second unit cell region 20 are defined in a front surface 51a of the wafer 51. The first cell unit region 10 and the second unit cell region 20 are extended along one direction in the plane parallel to the front surface 51a of the wafer 51.

Next, a resist film 52a is formed on the upper surface of the wafer 51 by coating or the like. Next, the resist film 52a is patterned by lithography. Accordingly, a plurality of grooves extending in one direction in the plane parallel to the front surface 51a of the wafer 51 are formed in the resist film 52a. Then N type impurities such as phosphorus are introduced into the front surface 51a of the wafer 51 by performing ion implantation or the like using the patterned resist film 52a as a mask. In this way, the N type hole barrier layer 38 that is extended along one direction is formed on the side of the front surface 51a of the wafer 51. The dose amount in the ion implantation is, for example, about $6 \times 10^{12}/cm^2$, and the implantation energy is, for example, about 80 KeV. After that, the resist film 52a is removed by ashing or the like.

Next, as shown in FIG. 5, a resist film 52b is formed on the front surface 51a of the wafer 51 by coating or the like. Next, the resist film 52b is patterned by lithography. The resist film 52b is patterned in such a way that it covers the N type hole barrier layer 38 and a plurality of grooves extending in one direction are formed in parts other than the N type hole barrier layer 38. Then P type impurities such as boron are introduced into the front surface 51a of the wafer 51 by performing ion implantation or the like using the patterned resist film 52b as a mask. Accordingly, the P type floating layer 33 that is extended along one direction is formed between the N type hole barrier layers 38 on the front surface 51a of the wafer 51. The dose amount in the ion implantation is, for example, about $3.5 \times 10^{13}/cm^2$, and the implantation energy is, for example, about 75 KeV. After that, the resist film 52b is removed by ashing or the like.

Next, as shown in FIG. 6, a hard mask film 53 is formed on the front surface 51a of the wafer 51 by, for example, Chemical Vapor Deposition (CVD). The hard mask film 53 is, for example, a silicon oxide film. The thickness of the hard mask film 53 is, for example, 450 nm.

Next, as shown in FIG. 7, a resist film 52c is formed on the hard mask film 53 by coating or the like. Then the resist film 52c is patterned by lithography. The resist film 52c is patterned in such a way as to cover the N type hole barrier layer 38 and the P type floating layer 33. Next, the hard mask film 53 is patterned by, for example, dry etching using the patterned resist film 52c as a mask. After that, the resist film 52c is removed by asking or the like.

Next, as shown in FIG. 8, the plurality of trenches 34 are formed by, for example, anisotropic dry etching using the patterned hard mask film 53. The plurality of trenches 34 are formed on the respective sides of the N-type hole barrier layer 37 in such a way as to sandwich the N type hole barrier layer 38 from the both sides thereof. Gad such as $Cl_2/O_2$ gas is used, for example, for the anisotropic dry etching.

After that, as shown in FIG. 9, the hard mask film 53 is removed by, for example, wet etching. The wet etching is performed using, for example, an etchant containing hydrofluoric acid.

Next, as shown in FIG. 10, the P type floating layer 33 and the N type hole barrier layer 38 are diffused. These layers are diffused by, for example, performing thermal treatment for about minutes under the temperature of 1200° C. Further, the insulating film 35 is formed on the front surface 51a of the wafer 51 and the inner surfaces of the trenches 34 by, for example, thermal oxidation or the like. The thickness of the insulating film 35 is, for example, about 120 nm.

Next, as shown in FIG. 11, a Doped Poly-Silicon film 54 into which phosphorus is doped is formed on the front surface 51a of the wafer 51 on the insulating film 35 and inside the trenches 34 by, for example, CVD or the like in such away as to fill the trenches 34. The thickness of the doped polysilicon film 54 on the front surface 51a of the wafer 51 is, for example, about 600 nm.

Next, as shown in FIG. 12, the doped polysilicon film 54 is etched back to the insulation film 35 on the front surface 51a of the wafer 51 by, for example, dry etching. In this way, the trenches 34 are filled with the doped polysilicon film 54 to form the trench electrodes 13a, 13b, 23a, and 23b. In this embodiment, the lower end of the P type floating layer 33 is made deeper than the lower end of the trench electrodes 13a, 13b, 23a, and 23b on both sides thereof.

Next, as shown in FIG. 13, the insulating film 35 on the front surface 51a of the wafer 51 in the outside of the trenches 34 is removed by wet etching or the like. The wet etching is performed using, for example, an etchant containing hydrofluoric acid.

Next, as shown in FIG. 14, an insulating film 55 is formed on the upper surface of the wafer 51 by, for example, thermal oxidation or CVD. The thickness of the insulating film 55 is made equal to that of the insulating film 35. Next, P type impurities such as boron are introduced from the front surface 51a of the wafer 51 by ion implantation or the like and the P type body layer 36 that is extended along one direction is formed closer to the front surface 51a than the P type floating layer 33 and the N type hole barrier layer 38 are. The dose amount in the ion implantation is, for example, about $3 \times 10^{13}/cm^2$ and the implantation energy is, for example, about 75 KeV.

Next, a resist film (not shown) is formed on the upper surface of the wafer 51 and patterning is performed. The resist film (not shown) is patterned in such a way as to cover the P type floating layer 33. Then N type impurities such as arsenic are introduced by ion implantation using the patterned resist film (not shown) as a mask. Accordingly, the N+ type emitter layer 15 is selectively formed between the trench electrodes 13a and 13b, the N+ type emitter layer 15 being formed closer to the front surface 51a than the P type body layer 36 formed on the N type hole barrier layer 38 is. The dose amount in the ion implantation is, for example, about $5 \times 10^{15}/cm^2$. The implantation energy is, for example, about 80 KeV. After that, the unnecessary resist film (not shown) is removed by asking or the like.

Next, as shown in FIG. 15, the inter-layer insulating film 45 is formed on the front surface 51a of the wafer 51 by, for example, CVD. The inter-layer insulating film 45 is, for example, a Phosphsilicate Glass (PSG) film. The thickness of the inter-layer insulating film 45 is, for example, about 600 nm. The inter-layer insulating film 45 may be other than the PSG film and may be, for example, a Borophosphsilicate Glass (BPSG) film, a Non-doped Silicate Glass (NSG) film, a Spin-On-Glass (SOG) film, or a composite film thereof.

Next, as shown in FIG. 16, a resist film 52d is formed on the inter-layer insulating film 45. Next, the resist film 52d is patterned in such a way that it includes grooves that are extended in one direction on the N type hole barrier layer 38 by lithography. Then the contact grooves 31 are formed in the inter-layer insulating film 45 on the N type hole barrier layer 38 by, for example, anisotropic dry etching or the like using the patterned resist film 52d. Gas such as $Ar/CHF_3/CF_4$ is used, for example, for the anisotropic dry etching.

After that, as shown in FIG. 17, the unnecessary resist film 52d is removed by asking or the like. Next, the contact grooves 31 are extended in the wafer 51 using, for example, the inter-layer insulating film 45 by anisotropic dry etching. The contact grooves 31 are formed in such a way that they reach the P type body layer 36. In the part where the N+ type emitter layer 15 is formed, the contact groove 31 is formed in such a way as to penetrate through the N+ type emitter layer 15. Gas including $Cl_2/O$ or the like is used, for example, for the anisotropic dry etching.

Next, as shown in FIG. 18, the P+ type body contact layer 32 is formed on the N type hole barrier layer 38 by ion-implanting P type impurities such as $BF_2$ through the contact groove 31. The dose amount in the ion implantation is, for example, about $5\times10^{15}/cm^2$ and the implantation energy is, for example, about 80 KeV.

In a similar way, for example, the P+ type latch-up prevention layer 37 is formed below the P+ type body contact layer 32 by ion implanting P type impurities such as boron through the contact groove 31. The dose amount in the ion implantation is, for example, about $5\times10^{15}/cm^2$ and the implantation energy is, for example, about 80 KeV.

Next, as shown in FIG. 19, the emitter electrode 46 such as metal connected to the P type body layer 36 is formed on the inter-layer insulating film 45 and inside the contact grooves 31 by, for example, sputtering or the like. Before the emitter electrode 46 is formed, a TiW film may be formed on the inter-layer insulating film 45 and inside the contact grooves 31 as a barrier metal film. Further, in a contact groove (not shown), the trench electrodes 23a and 23b of the second unit cell region 20 are connected to the emitter electrode 46. Further, in a cell peripheral junction region (not shown), the trench electrodes 13a and 13b of the first unit cell region 10 are connected to the gate wiring.

Next, the rear surface of the wafer 51 is subjected to backgrinding processing, whereby the wafer thickness is made as thin as about 200 to 30 micrometers, for example, as necessary. When the breakdown voltage is, for example, about 600 volts, the final thickness becomes about 70 micrometers. Accordingly, the semiconductor substrate 1 including the wafer 51 having a predetermined thickness is formed. Note that chemical etching or the like for removing the damages of the rear surface of the wafer 51 may also be performed as necessary.

Next, as shown in FIG. 20, the N type field stop layer 41 is formed on the rear surface 1b of the semiconductor substrate 1 by, for example, introducing N type impurities such as phosphorus by ion implantation. The dose amount in the ion implantation is, for example, about $7\times10^{12}/cm^2$ and the implantation energy is, for example, about 350 KeV. The N− type drift layer 39 is provided to be closer to the front surface 1a than the N type field stop layer 41 is and to be closer to the rear surface 1b than the P type floating layer 33 and the N type hole barrier layer 38 are. Further, the wafer 51 is called the semiconductor substrate 1.

After that, as necessary, for activation of impurity, the rear surface 1b of the semiconductor substrate 1 is subjected to laser annealing or the like. Next, P type impurities such as boron are introduced into the rear surface 1b of the semiconductor substrate 1 by, for example, ion implantation. Accordingly, the P+ type collector layer 42 is formed closer to the rear surface 1b than the N type field stop layer 41 is in the semiconductor substrate 1. The dose amount in the ion implantation is, for example, about $1\times10^{13}/cm^2$ and the implantation energy is, for example, about 40 KeV. After that, as necessary, for activation of impurity, the rear surface 1b of the semiconductor substrate 1 is subjected to laser annealing or the like.

Next, as shown in FIG. 21, a resist film 52e is formed on the rear surface 1b of the semiconductor substrate 1 by coating or the like. The resist film 52e is patterned by, for example, lithography in such a way that the resist film 52e includes an opening that is extended in one direction on the rear surface 1b of the semiconductor substrate 1 in the second unit cell region 20. A photolithography apparatus including a rear surface aligner function is used, for example, in such a way that the opening is located below the N type hole barrier layer 38 in the second unit cell region 20. Next, N type impurities are introduced into the P+ type collector layer 42 by, for example, ion implantation using the patterned resist film 52e as a mask. In this way, the N type cathode layer 47 that is extended in one direction is formed in the P+ type collector layer 42.

At this time, the N type cathode layer 47 is preferably formed along the line that passes the center of the second unit cell region 20 in the other direction. Further, in the other direction, the length of the N type cathode layer 47 is preferably made smaller than the length of the N type hole barrier layer 38 in the other direction in the second unit cell region 20. Further, when the trench electrodes 23a and 23b in the second unit cell region 20 are projected in the direction toward the rear surface 1b from the front surface 1a, the N type cathode layer 47 is preferably formed in the region surrounded by the trench electrodes 23a and 23b projected onto the P+ type collector layer 42.

Next, as shown in FIG. 22, the unnecessary resist film 52e (not shown) is removed by asking or the like.

Next, as shown in FIG. 23, the collector electrode 43 made of metal or the like is formed substantially on the whole surface of the rear surface 1b of the semiconductor substrate 1 by, for example, sputtering film forming. Accordingly, in the first unit cell region 10, the P+ type collector layer 42 and the collector electrode 43 are connected to each other. In the second unit cell region, the P+ type collector layer 42 and the collector electrode 43 are connected to each other and the N type cathode layer 47 and the collector electrode 43 are connected to each other. In this way, the semiconductor device 100 is manufactured. After that, the semiconductor device 100 is divided into chip regions of the semiconductor substrate 1 by dicing or the like and the chip regions thereof are sealed into packages as necessary.

Figure 24:
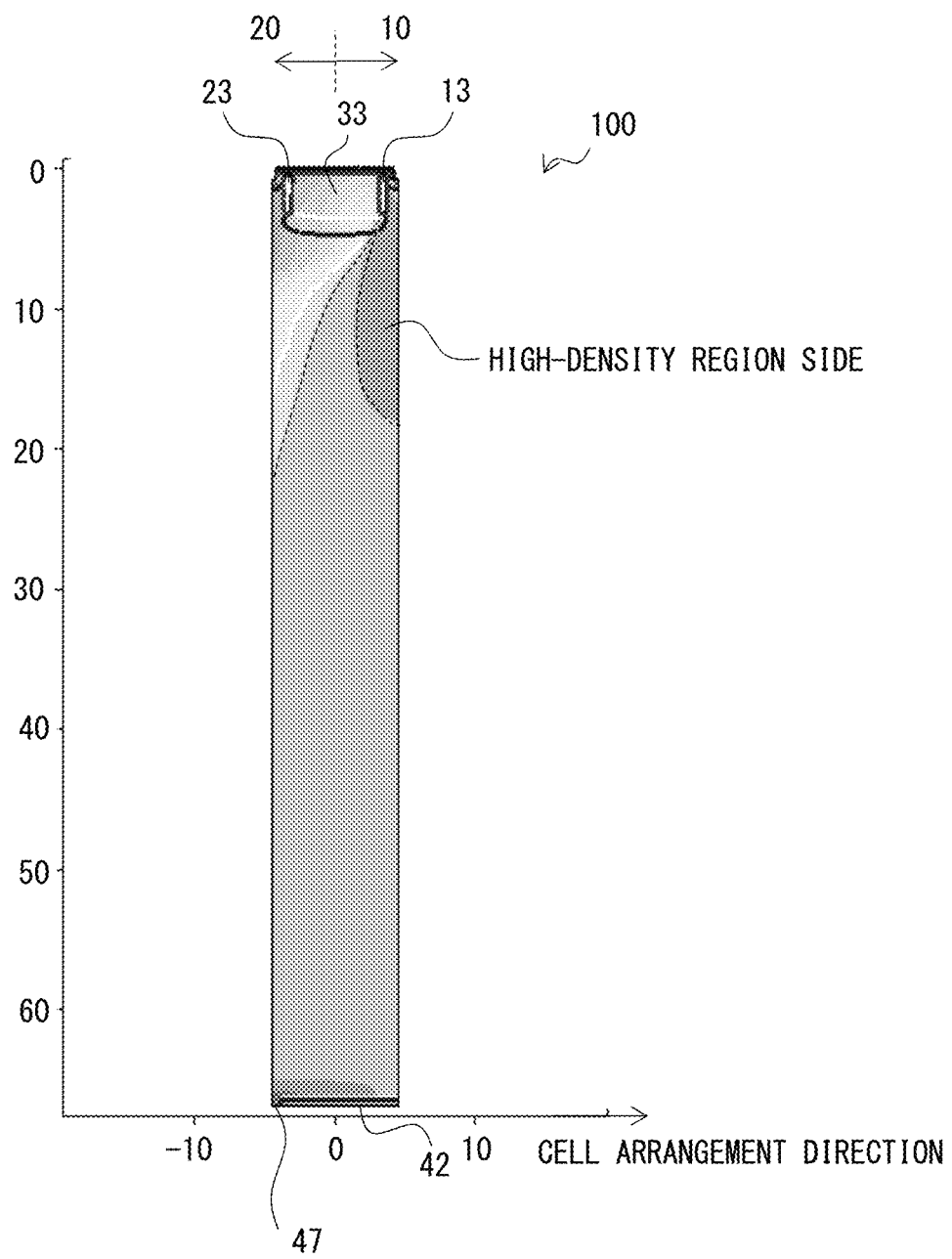
FIG. 24 is a distribution diagram exemplifying an electron current density when the semiconductor device according to the embodiment is in an ON state.
Figure 25:
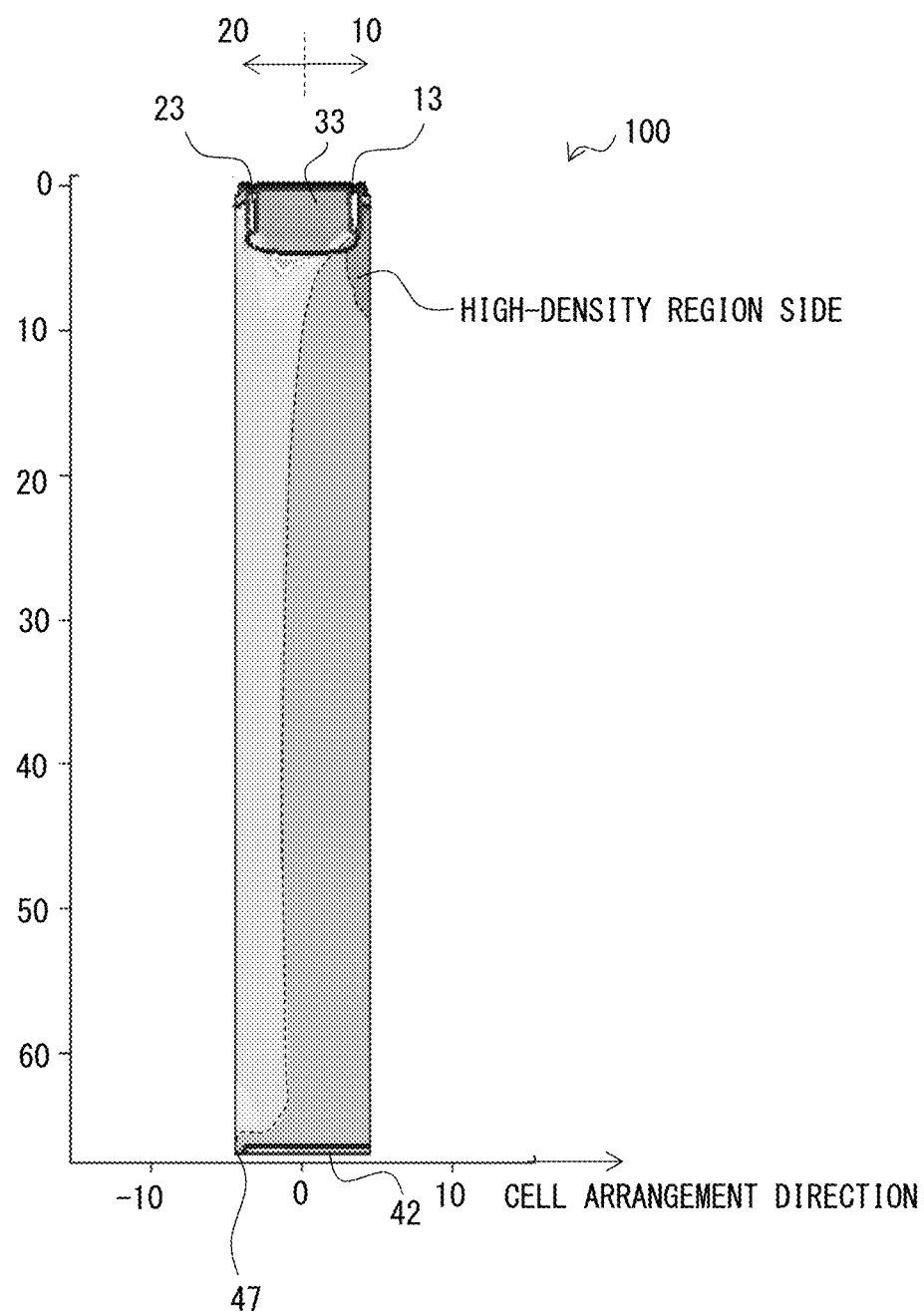
FIG. 25 is a distribution diagram exemplifying the electron current density when the semiconductor device according to the embodiment is in an ON state.

Next, effects of this embodiment will be described. FIGS. 24 and 25 each show a distribution diagram exemplifying an electron current density when the semiconductor device 100 according to this embodiment is in an ON state. The horizontal axis indicates the position in the cell arrangement direction and the vertical axis indicates the thickness direction of the semiconductor substrate 1. The interval between the trench electrodes in the cell arrangement direction is, for example, 2.26 μm, the width of the P type floating layer 33 is 6.78 μm, and the width of the N type cathode layer 47 is 1 μm. This is an ON state in which a voltage of 15 V is applied to the trench electrode 13. The amount of the current in the semiconductor device 100 shown in FIG. 24 is smaller than the amount of the current in the semiconductor device 100 shown in FIG. 25.

As shown in FIGS. 24 and 25, in the semiconductor device 100 according to this embodiment, the N type cathode layer 47 that is extended along one direction is provided in the P+ type collector layer 42 of the second unit cell region 20. The high electron density region has not diffused in the cell arrangement direction from the FET region 11. In this way, it is possible to suppress the electrons injected from the FET region 11 on the side of the front surface 1a of the semiconductor substrate 1 from diffusing in the cell arrangement direction. It is therefore possible to reduce the amount of electrons flowing into the N type cathode layer 47 and to suppress snapback. The diffusion of the electron current density in the cell arrangement direction when the current level in the semiconductor device 100 is low (FIG. 24) is larger than that when the current level in the semiconductor device 100 is high (FIG. 25). Therefore, the snapback suppression effect by the N type cathode layer 47 tends to become larger when the current level is higher.

Further, since the electrons flowing into the N type cathode layer 47 are reduced in the semiconductor device 100, the reverse recovery current $I_{RP}$ can be reduced and the reverse recovery loss Err can be further suppressed.

On the other hand, in general, in the RC-IGBT in which the IGBT and the FWD are formed into one chip, electrons flow into the N type cathode layer of the FWD. Accordingly, the hole injection from the P+ type collector layer of the IGBT is suppressed. Accordingly, conductivity modulation rarely occurs. Accordingly, snapback occurs. This causes an increase in the reverse recovery current $I_{RP}$ and an increase in the reverse recovery loss Err since electrons also diffuse into the IGBT at the time of FWD operation in the RC-IGBT.

The N type cathode layer 47 according to this embodiment is formed along the line that passes the center of the second unit cell region 20 in the cell arrangement direction. It is therefore possible to maximize the distance from the FET region 11 of the first unit cell regions 10 on the both sides to the N type cathode layer 47. It is therefore possible to suppress the electrons from flowing into the N type cathode layer 47.

Further, in the cell arrangement direction, the width of the N type cathode layer 47 is made smaller than the width of the N type hole barrier layer 38 of the second unit cell region 20 in the cell arrangement direction. It is therefore possible to improve the function of the FWD while suppressing the electrons from flowing into the cathode layer 47.

Further, when the trench electrodes 23a and 23b in the second unit cell region 20 are projected in the direction toward the rear surface 1b from the front surface 1a, the N type cathode layer 47 is formed in the region surrounded by the trench electrodes 23a and 23b projected onto the P+ type collector layer 42. From this structure as well, it is possible to improve the function of the FWD while suppressing the electrons from flowing into the cathode layer 47.

When the plurality of first unit cell regions and the plurality of second unit cell regions are alternately provided in the cell arrangement direction, both the second unit cell in which the N type cathode layer 47 is provided and the second unit cell in which the N type cathode layer 47 is not provided are included. It is therefore possible to adjust and optimize the tradeoff between suppression of snapback and improvement of FWD characteristics. The N+ type emitter layer 15 is provided in the first unit cell region. It is therefore possible to improve switching in the IGBT.

The P type floating layer 33 is provided between the FET region 11 and the dummy cell region 21. By providing the P type floating layer 33, the width of the floating region 30, that is, the length thereof in the cell arrangement direction, can be increased without causing a sudden decrease in the breakdown voltage. It is therefore possible to effectively enhance the hole storage effect.

The lower end of the P type floating layer 33 is made deeper than the lower end of the trench electrodes on the both sides. Accordingly, even when the width of the floating region 30 is made larger than the width of the FET region 11, it becomes easy to maintain the breakdown voltage. It is therefore possible to improve the IE effects.

The emitter electrode 46 is connected via the contact groove 31. It is therefore possible to make the trench electrode of the second unit cell region 20 have an emitter potential. Further, by providing the P+ type latch-up prevention layer 37 and the P+ type body contact layer 32, it is possible to maintain the balance of flow of holes.

Further, by making the length of the first unit cell region 10 equal to that of the second unit cell region 20 in the cell arrangement direction, hole distribution can be made uniform.

While the invention made by the present inventors has been specifically described based on the embodiment, it is needless to say that the present invention is not limited to the embodiment stated above and various changes may be made on the present invention without departing from the spirit of the present invention.

For example, specific impurities ion-implanted in order to form the hole barrier layer 38, the body layer 36, the floating layer 33, the field stop layer 41, the collector layer 42 and the like, the doped amount, and the implantation energy are merely examples and are not limited to those stated above. Further, the formation of the impurity layers is not limited to ion implantation. The gases used for etching stated above are merely examples and other gases may be used. Unless otherwise specified, the order of the processes in the manufacturing method of the semiconductor device 100 may be changed as appropriate. The details of the method of manufacturing the semiconductor device are described in the following Supplementary Notes.

(Supplementary Note 1)

A method of manufacturing a semiconductor device comprising:

a first unit cell region that is extended along one direction in a plane parallel to a first principal surface in a semiconductor substrate including the first principal surface and a second principal surface;

a second unit cell region that is provided in the semiconductor substrate and is extended in the one direction, the method comprising the process of:

forming a hole barrier layer of a first conductive type extending in the one direction on the side of the first principal surface of the semiconductor substrate;

forming trenches on respective sides of the hole barrier layer in such a way as to sandwich the hole barrier layer from the both sides;

forming an insulating film on an inner surface of the trench;

filling the trench in which the insulating film is formed to form a trench electrode;

forming a body layer of a second conductive type extended in the one direction to be closer to the first principal surface than the hole barrier layer is;

forming an emitter electrode connected to the body layer;

forming a field stop layer of a first conductive type on the side of the second principal surface of the semiconductor substrate;

forming a collector layer of a second conductive type to be closer to the second principal surface than the field stop layer in the semiconductor substrate is, the method further comprising the process of:

connecting the trench electrode of the first unit cell region to a gate wiring;

connecting the trench electrode of the second unit cell region to the emitter electrode;

forming a cathode layer of a first conductive type in such a way that it extends in the one direction in the collector layer in the second unit cell region; and connecting the field stop layer and a collector electrode by connecting the collector electrode to the cathode layer.

(Supplementary Note 2)

The method of manufacturing the semiconductor device, further comprising a process of forming the cathode layer along the line that passes the center of the second unit cell region in the other direction.

(Supplementary Note 3)

The method of manufacturing the semiconductor device, wherein, in the other direction perpendicular to the one direction, the length of the cathode layer is made smaller than the length of the hole barrier layer in the other direction in the second unit cell region.

(Supplementary Note 4)

The method of manufacturing the semiconductor device, wherein, when the trench electrodes in the second unit cell region are projected in a direction from the first principal surface toward the second principal surface, the cathode layer is formed in a region surrounded by the trench electrodes projected onto the collector layer.

(Supplementary Note 5)

The method of manufacturing the semiconductor device, comprising:

forming a plurality of the first unit cell regions and a plurality of the second unit cell regions alternately in the other direction;

wherein the second unit cell regions comprise:
the second unit cell regions in which the cathode layer is provided; and
the second unit cell regions in which the cathode layer is not provided.

(Supplementary Note 6)

The method of manufacturing the semiconductor device, further comprising a process of forming an emitter layer of a first conductive type to be closer to the first principal surface than the body layer is between the trench electrodes of the first unit cell region.

(Supplementary Note 7)

The method of manufacturing the semiconductor device, further comprising a process of forming a floating layer of a second conductive type that is extended in the one direction on the drift layer, the method comprising:

forming the trench electrode between the hole barrier layer and the floating layer; and forming the gate insulating film also between the trench electrode and the floating layer.

(Supplementary Note 8)

The method of manufacturing the semiconductor device, wherein the lower end of the floating layer is made deeper than the lower end of the trench gate electrodes on the both sides of the floating layer.

(Supplementary Note 9)

The method of manufacturing the semiconductor device, further comprising processes of:

forming an inter-layer insulating film on the body layer;

forming a contact groove that is extended in the one direction, the contact groove penetrating through the inter-layer insulating film and has reached the body layer; and connecting the emitter electrode to the body layer via the contact groove.

(Supplementary Note 10)

The method of manufacturing the semiconductor device, further comprising processes of:

forming a latch-up prevention layer of a second conductive type below the contact groove; and forming a body contact layer of a second conductive type to be closer to the first principal surface than the latch-up prevention layer is in the semiconductor substrate.

(Supplementary Note 11)

The method of manufacturing the semiconductor device, wherein the length of the first unit cell region in the other direction is made substantially equal to the length of the second unit cell region when seen from the direction perpendicular to the first principal surface.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
a semiconductor substrate including a first principal surface and a second principal surface;
an emitter electrode and a gate wiring provided in the first principal surface;
a collector electrode provided in the second principal surface; and
a first unit cell region that is extended along one direction in a plane parallel to the first principal surface and a second unit cell region that is extended in the one direction when they are seen from the side of the first principal surface, wherein
the semiconductor substrate of the first unit cell region and the second unit cell region comprises:
a drift layer of a first conductive type;
a hole barrier layer of a first conductive type that is provided to be closer to the first principal surface than the drift layer is and is extended in the one direction;
a pair of trench electrodes that are provided in such a way as to sandwich the hole barrier layer from both sides thereof in another direction perpendicular to the one direction and are extended in the one direction;
a body layer of a second conductive type that is provided to be closer to the first principal surface than the hole barrier layer is, is extended in the one direction, and is connected to the emitter electrode;
an insulating film that is provided between the trench electrode, and the drift layer, the hole barrier layer, and the body layer;
a field stop layer of a first conductive type provided to be closer to the second principal surface than the drift layer is; and
a collector layer of a second conductive type that is provided to be closer to the second principal surface than the field stop layer is and is connected to the collector electrode,
the trench electrode of the first unit cell region is connected to the gate wiring,
the trench electrode of the second unit cell region is connected to the emitter electrode, and the semiconductor substrate of the second unit cell region includes a cathode layer of a first conductive type that is fitted into the collector layer, extended in the one direction, and connects the collector electrode and the field stop layer.

2. The semiconductor device according to claim 1, wherein the cathode layer is provided along a line that passes the center of the second unit cell region in the other direction.

3. The semiconductor device according to claim 1, wherein the length of the cathode layer in the other direction is smaller than the length of the hole barrier layer in the other direction in the second unit cell region.

4. The semiconductor device according to claim 1, wherein when the trench electrodes in the second unit cell region are projected in a direction from the first principal surface toward the second principal surface, the cathode layer is formed in a region surrounded by the trench electrodes projected onto the collector layer.

5. The semiconductor device according to claim 1, wherein
a plurality of the first unit cell regions and a plurality of the second unit cell regions are alternately provided in the other direction, and
the second unit cell regions comprise:
the second unit cell region in which the cathode layer is provided; and
the second unit cell region in which the cathode layer is not provided.

6. The semiconductor device according to claim 1, further comprising an emitter layer of a first conductive type provided between the trench electrodes of the first unit cell region, the emitter layer being provided to be closer to the first principal surface than the body layer is,
wherein the insulating film is also provided between the emitter layer and the trench electrode.

7. The semiconductor device according to claim 1, further comprising a floating layer of a second conductive type that is provided to be closer to the first principal surface than the drift layer is and is extended in the one direction, wherein
the body layer is also provided to be closer to the first principal surface than the floating layer is,
the trench electrode is provided between the hole barrier layer and the body layer, and the floating layer, and
the insulating film is provided between the trench electrode and the floating layer.

8. The semiconductor device according to claim 7, wherein the lower end of the floating layer is closer to the second principal surface than the lower end of the trench electrode is.

9. The semiconductor device according to claim 1, further comprising an inter-layer insulating film provided on the body layer,
wherein the emitter electrode is contacted to the body layer via a contact groove, the contact groove being provided in such a way as to extend in the one direction, penetrate through the inter-layer insulating film, and reach the body layer.

10. The semiconductor device according to claim 9, further comprising:
a latch-up prevention layer of a second conductive layer provided below the contact groove; and
a body contact layer of a second conductive type provided between the emitter electrode and the latch-up prevention layer.

11. The semiconductor device according to claim 1, wherein the length of the first unit cell region in the other direction is substantially equal to the length of the second unit cell region when seen from the direction perpendicular to the first principal surface.

12. An RC-IGBT comprising:
a semiconductor substrate including a first principal surface and a second principal surface;
an emitter electrode and a gate wiring provided in the first principal surface;
a collector electrode provided in the second principal surface; and
a first unit cell region that is extended along one direction in a plane parallel to the first principal surface and a second unit cell region that is extended in the one direction when they are seen from the side of the first principal surface, wherein
the semiconductor substrate of the first unit cell region and the second unit cell region comprises:
a drift layer of a first conductive type;
a hole barrier layer of a first conductive type that is provided to be closer to the first principal surface than the drift layer is and is extended in the one direction;
a pair of trench electrodes that are provided in such a way as to sandwich the hole barrier layer from both sides thereof in another direction perpendicular to the one direction and are extended in the one direction;
a body layer of a second conductive type that is provided to be closer to the first principal surface than the hole barrier layer is, is extended in the one direction, and is connected to the emitter electrode;
an insulating film that is provided between the trench electrode, and the drift layer, the hole barrier layer, and the body layer;
a field stop layer of a first conductive type provided to be closer to the second principal surface than the drift layer is; and
a collector layer of a second conductive type that is provided to be closer to the second principal surface than the field stop layer is and is connected to the collector electrode,
the trench electrode of the first unit cell region is connected to the gate wiring,
the trench electrode of the second unit cell region is connected to the emitter electrode, and
the semiconductor substrate of the second unit cell region includes a cathode layer of a first conductive type that is fitted into the collector layer, extended in the one direction, and connects the collector electrode and the field stop layer.

13. The RC-IGBT according to claim 12, wherein the cathode layer is provided along a line that passes the center of the second unit cell region in the other direction.

14. The RC-IGBT according to claim 12, wherein the length of the cathode layer in the other direction is smaller than the length of the hole barrier layer in the other direction in the second unit cell region.

15. The RC-IGBT according to claim 12, wherein when the trench electrodes in the second unit cell region are projected in a direction from the first principal surface toward the second principal surface, the cathode layer is formed in a region surrounded by the trench electrodes projected onto the collector layer.

16. The RC-IGBT according to claim 12, wherein
a plurality of the first unit cell regions and a plurality of the second unit cell regions are alternately provided in the other direction, and the second unit cell regions comprise:
the second unit cell region in which the cathode layer is provided; and
the second unit cell region in which the cathode layer is not provided.

17. The RC-IGBT according to claim 12, further comprising an emitter layer of a first conductive type provided between the trench electrodes of the first unit cell region, the emitter layer being provided to be closer to the first principal surface than the body layer is,
wherein the insulating film is also provided between the emitter layer and the trench electrode.

18. The RC-IGBT according to claim 12, further comprising a floating layer of a second conductive type that is provided to be closer to the first principal surface than the drift layer is and is extended in the one direction, wherein
the body layer is also provided to be closer to the first principal surface than the floating layer is,
the trench electrode is provided between the hole barrier layer and the body layer, and the floating layer, and
the insulating film is provided between the trench electrode and the floating layer.

19. The RC-IGBT according to claim 18, wherein the lower end of the floating layer is closer to the second principal surface than the lower end of the trench electrode is.

20. A method of manufacturing a semiconductor device comprising:
a first unit cell region that is extended along one direction in a plane parallel to a first principal surface in a semiconductor substrate including the first principal surface and a second principal surface;
a second unit cell region that is provided in the semiconductor substrate and is extended in the one direction, the method comprising the process of:
forming a hole barrier layer of a first conductive type extending in the one direction on the side of the first principal surface of the semiconductor substrate;
forming trenches on respective sides of the hole barrier layer in such a way as to sandwich the hole barrier layer from the both sides;
forming an insulating film on an inner surface of the trench;
filling the trench in which the insulating film is formed to form a trench electrode;
forming a body layer of a second conductive type extended in the one direction to be closer to the first principal surface than the hole barrier layer is;
forming an emitter electrode connected to the body layer;
forming a field stop layer of a first conductive type on the side of the second principal surface of the semiconductor substrate;
forming a collector layer of a second conductive type to be closer to the second principal surface than the field stop layer is in the semiconductor substrate, the method further comprising the process of:
connecting the trench electrode of the first unit cell region to a gate wiring;
connecting the trench electrode of the second unit cell region to the emitter electrode;
forming a cathode layer of a first conductive type in such a way that it extends in the one direction in the collector layer in the second unit cell region; and
connecting the field stop layer and a collector electrode by connecting the collector electrode to the cathode layer.

\* \* \* \* \*